United States Patent
Kashihara et al.

(10) Patent No.: US 10,615,782 B2
(45) Date of Patent: Apr. 7, 2020

(54) SEMICONDUCTOR DEVICE

(71) Applicant: RENESAS ELECTRONICS CORPORATION, Tokyo (JP)

(72) Inventors: Yoji Kashihara, Tokyo (JP); Koichi Takeda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/248,372

(22) Filed: Jan. 15, 2019

(65) Prior Publication Data

US 2019/0260363 A1 Aug. 22, 2019

(30) Foreign Application Priority Data

Feb. 21, 2018 (JP) .................................. 2018-028609

(51) Int. Cl.
  H03K 3/00 (2006.01)
  H03K 3/356 (2006.01)
  (Continued)

(52) U.S. Cl.
  CPC .... *H03K 3/356113* (2013.01); *G11C 16/0425* (2013.01); *G11C 16/0466* (2013.01);
  (Continued)

(58) Field of Classification Search
  CPC ........ H03K 19/0013; H03K 19/018521; H03K 19/018528; H03K 19/00315;
  (Continued)

(56) References Cited

U.S. PATENT DOCUMENTS 6,466,054 B2 * 10/2002 Kameyama ...... H03K 19/01852
  326/63
2011/0205829 A1 8/2011 Iida
  (Continued)

FOREIGN PATENT DOCUMENTS

JP 11-308092 A 11/1999

OTHER PUBLICATIONS

Extended European Search Report issued in corresponding European Patent Application No. 19155259.5-1203, dated Jul. 29, 2019.

*Primary Examiner* — Long Nguyen
(74) *Attorney, Agent, or Firm* — McDermott Will & Emery LLP

(57) ABSTRACT

To stably operate a negative-voltage level shifter even when a voltage value of a high level of an input signal is lowered, a negative-voltage level shifter in a semiconductor device includes a first level shifter, a second level shifter, and a first medium-voltage generating circuit. The first level shifter converts a high level of an input signal from a positive first power-supply voltage to a first medium voltage. The second level shifter converts a low level of an output signal of the first level shifter from a third power-supply voltage to a negative fourth power-supply voltage that is lower than the third power-supply voltage. The first medium-voltage generating circuit generates the first medium voltage in such a manner that the first medium voltage is higher than the first power-supply voltage and is lower than a second power-supply voltage, and includes a source-follower NMOS transistor and a clamping PMOS transistor.

18 Claims, 23 Drawing Sheets

(51) Int. Cl.
*G11C 16/04* (2006.01)
*G11C 16/12* (2006.01)
*G11C 16/08* (2006.01)
*G11C 16/10* (2006.01)
*G11C 16/14* (2006.01)
*G11C 16/26* (2006.01)
*G11C 16/32* (2006.01)

(52) U.S. Cl.
CPC .......... *G11C 16/12* (2013.01); *G11C 16/0408* (2013.01); *G11C 16/08* (2013.01); *G11C 16/10* (2013.01); *G11C 16/14* (2013.01); *G11C 16/26* (2013.01); *G11C 16/32* (2013.01)

(58) Field of Classification Search
CPC ........ H03K 19/00361; H03K 3/356113; G11C 8/08; G11C 5/145; G11C 7/12
See application file for complete search history.

(56) References Cited

U.S. PATENT DOCUMENTS

2011/0299355 A1   12/2011  Rana
2019/0260362 A1*  8/2019  Kashihara .......... G11C 16/0466

\* cited by examiner

FIG. 3A  SELECTED BLOCK/ SELECTED CELL (WRITE) 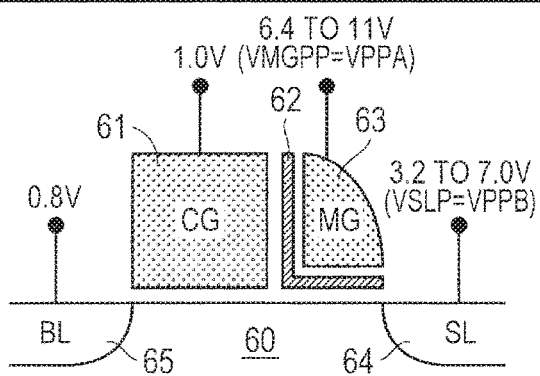
FIG. 3B  SELECTED BLOCK/ UNSELECTED CELL (NOT WRITE) 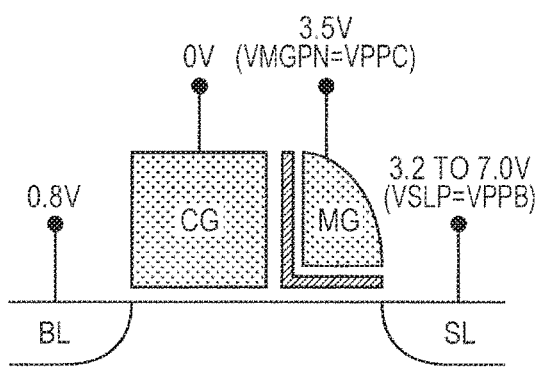
FIG. 3C  UNSELECTED BLOCK/ SELECTED CELL (NOT WRITE) 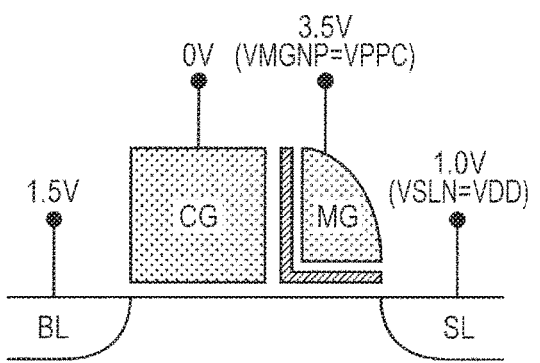
FIG. 3D  UNSELECTED BLOCK/ UNSELECTED CELL (NOT WRITE) 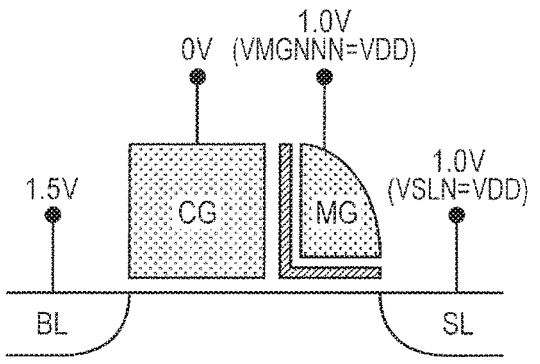

| | | |
|---|---|---|
| FIG. 4A | SELECTED BLOCK/ SELECTED CELL (ERASE) | 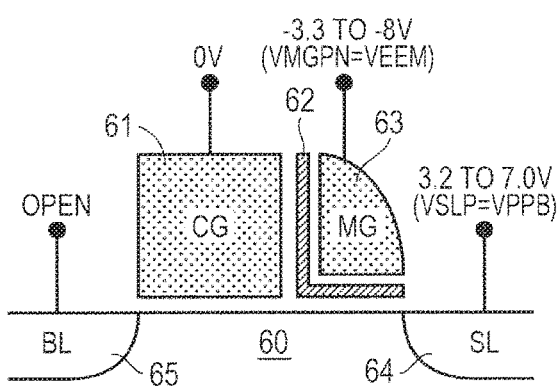 |
| FIG. 4B | SELECTED BLOCK/ UNSELECTED CELL (NOT ERASE) | 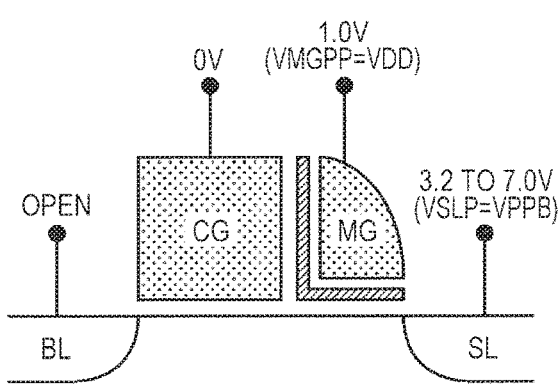 |
| FIG. 4C | UNSELECTED BLOCK/ SELECTED CELL (NOT ERASE) | NO STATE |
| FIG. 4D | UNSELECTED BLOCK/ UNSELECTED CELL (NOT ERASE) | 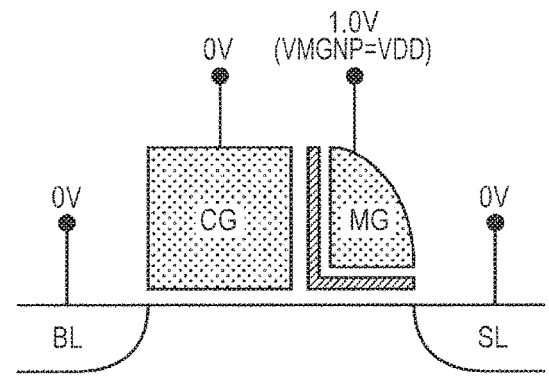 |

SEMICONDUCTOR DEVICE

CROSS-REFERENCE TO RELATED APPLICATIONS

The disclosure of Japanese Patent Application No. 2018-028609 filed on Feb. 21, 2018 including the specification, drawings and abstract is incorporated herein by reference in its entirety.

BACKGROUND

The present disclosure relates to a semiconductor device, and is suitably used in a semiconductor device including a level shifter for converting a lower-potential side voltage level of an input signal to a negative high voltage, for example.

A nonvolatile memory circuit including a logic circuit mixed thereinto uses a low-voltage power supply (VDD, for example, about 1.0 V), a medium voltage power supply (VCC, for example, about 3 V), a positive high-voltage power supply (VPP, for example, about 11 V at most), and a negative high-voltage power supply (VEE, for example, about −8 V at most), for example.

Specifically, a low power-supply voltage VDD is used in a logic circuit portion. A medium power-supply voltage VCC is used in a peripheral circuit in a nonvolatile memory. A positive high voltage VPP is used for wiring data to a nonvolatile memory cell. A negative high voltage VEE is used for erasing data from a nonvolatile memory cell. The positive high voltage VPP is generated by boosting the medium power-supply voltage VCC. The negative high voltage VEE is generated by boosting a reference voltage VSS (0 V) to a negative direction.

In a peripheral circuit of a nonvolatile memory, level shifters are provided. One converts a VDD/VSS-level signal (that is, a signal of which a high level is the low power-supply voltage VDD and a low level is the reference voltage VSS) into a VPP/VSS-level signal. The other converts a VDD/VSS-level signal into a VDD/VEE-level signal. Hereinafter, the former level shifter that uses the positive high voltage VPP is referred to as a positive-voltage level shifter, and the latter level shifter that uses the negative high voltage VEE is referred to as a negative-voltage level shifter.

The negative-voltage level shifter has to operate even when the negative high-voltage power supply is inactive, that is, the reference voltage VSS is supplied in place of the negative high voltage VEE. As such a negative-voltage level shifter that can operate both when the negative power supply is active and when the negative power supply is inactive, there is known a negative-voltage level shifter disclosed in Japanese Unexamined Patent Application Publication No. Hei 11 (1999)-308092.

Specifically, the negative-voltage level shifter described in this document includes a pair of cross-coupled NMOS (N-channel Metal Oxide Semiconductor) transistors coupled a line for supplying the negative power-supply voltage VEE and a pair of input PMOS (P-channel MOS) transistors coupled to a line for supplying the power-supply voltage VDD, and a breakdown-voltage relaxing circuit. The breakdown-voltage relaxing circuit includes a pair of PMOS transistors and a pair of NMOS transistors for breakdown-voltage relaxation. To the gates of the breakdown-voltage relaxing NMOS transistors, the reference voltage VSS is supplied when the negative power supply is active, and the power-supply voltage VDD is supplied when the negative power supply is inactive.

SUMMARY

For a logic circuit portion, scaling proceeds, so that the size is reduced year after year. In association with this, a value of the low power-supply voltage VDD is lowered. Meanwhile, for a high breakdown-voltage MOS transistor used for a nonvolatile memory, such as a flash memory, downsizing is difficult and a threshold voltage cannot be lowered. Therefore, values of the medium power-supply voltage VCC, the positive high voltage VPP, and the negative high voltage VEE are not changed from the conventional values.

The above situation makes a circuit configuration of a negative-voltage level shifter that uses the negative power-supply voltage VEE difficult, in a peripheral circuit of a nonvolatile memory including a logic circuit mixed thereinto. Specifically, as a positive voltage supplied to the negative-voltage level shifter, VDD that is the lowest positive power-supply voltage is used from a viewpoint of breakdown-voltage relaxation. Meanwhile, the negative-voltage level shifter has to operate even when the negative high-voltage power supply is inactive, that is, the reference voltage VSS is supplied in place of the negative high voltage VEE as described above. Therefore, when the low power-supply voltage VDD is lowered excessively because of downsizing, the negative-voltage level shifter is difficult to operate in a case where the negative high-voltage power supply is inactive.

For example, in a case where a central value of the low power-supply voltage VDD is 1 V, a lower limit can be about 0.8 to 0.9 V. Meanwhile, a threshold Vth of a high breakdown-voltage MOS transistor used in the negative-voltage level shifter may be about 1 V depending on a condition. Therefore, VDD<Vth may be established. In this case, the negative-voltage level shifter does not operate normally.

This tendency is more significant in a negative-voltage level shifter including a breakdown-voltage relaxing MOS transistor. The reason is as follows. The breakdown-voltage relaxing MOS transistor has to be coupled to a cross-coupled MOS transistor and an input MOS transistor in series thereto. Therefore, four high breakdown-voltage MOS transistors having a high threshold voltage are coupled in series, resulting in increase of a resistance value of a current path and further reduction of a margin against lowering of the low power-supply voltage VDD.

Other objects and novel features will be apparent from the description of this specification and the accompanying drawings.

A semiconductor device according to an embodiment includes a negative-voltage level shifter. The negative-voltage level shifter includes a first level shifter that converts a high level of an input signal from a first power-supply voltage to a medium voltage and a second level shifter that converts a low level of an output signal of the first level shifter to a negative high voltage. The medium voltage is between the first power-supply voltage and a second power-supply voltage higher than the first power-supply voltage.

According to the above-described embodiment, the negative-voltage level shifter is allowed to stably operate even when a voltage value of the high level of the input signal is lowered.

BRIEF DESCRIPTION OF THE DRAWINGS

FIGS. 3A to 3D illustrate an example of voltages applied to a memory cell in data writing in a table format.

FIGS. 4A to 4D illustrate an example of voltages applied to a memory cell in data erasing in a table format.

DETAILED DESCRIPTION

Embodiments are described in detail with reference to the drawings. The same or corresponding portions are labeled with the same reference sign, and the description thereof is not repeated.

In the following description, a microcomputer including a flash memory module is described as an example of a semiconductor device including a negative-voltage level shifter. However, the semiconductor device is not limited to the following example. For example, the semiconductor device can be configured only by a flash memory. The technique of the present disclosure can be applied to any semiconductor device including a negative-voltage level shifter.

First Embodiment

[Microcomputer]

Figure 1:
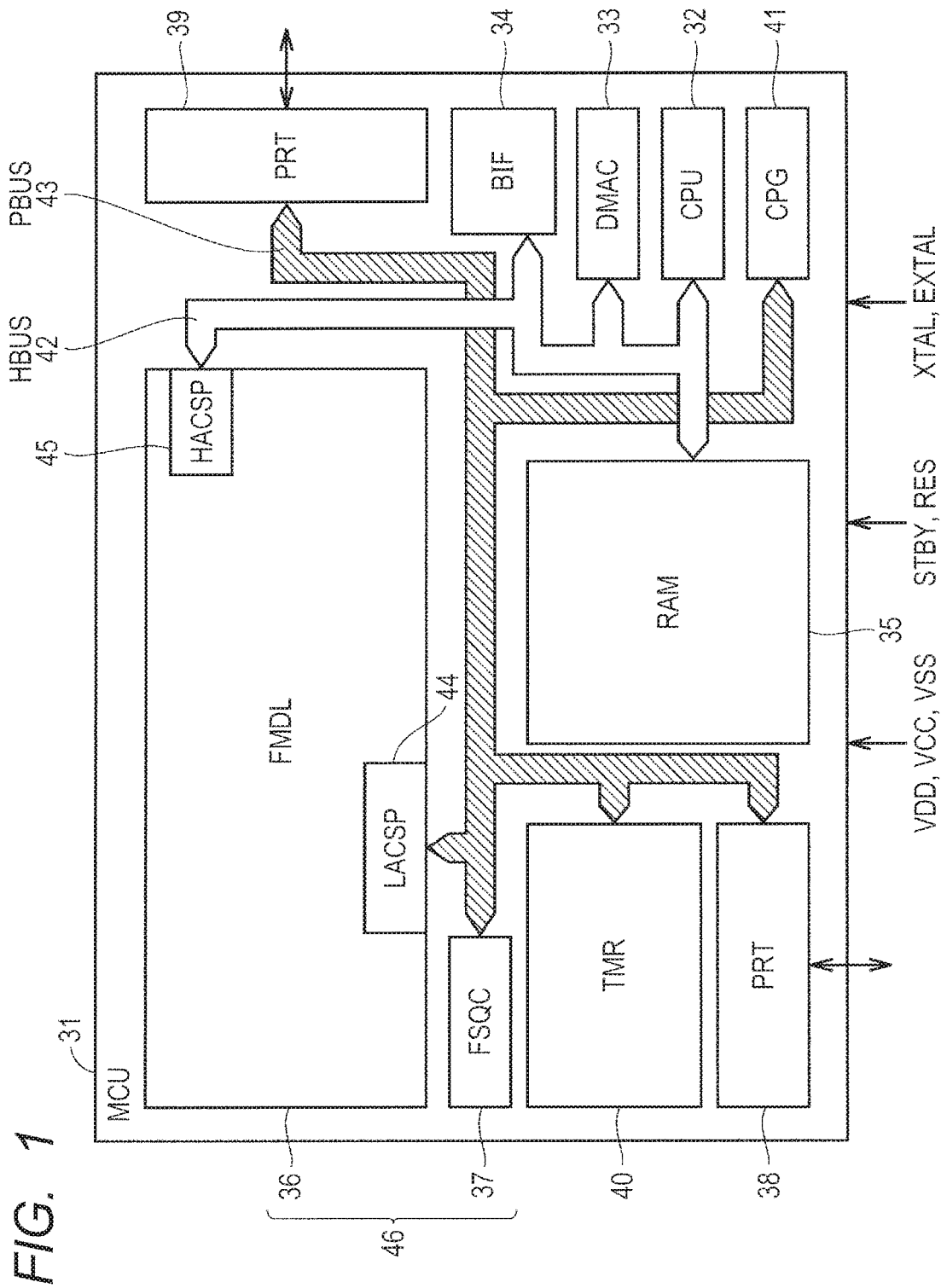
FIG. 1 is a block diagram illustrating a configuration of a semiconductor device according to a first embodiment.

FIG. 1 is a block diagram illustrating a configuration of a semiconductor device according to a first embodiment. FIG. 1 illustrates a configuration of a microcomputer or a micro controller unit (MCU) 31 as an example of the semiconductor device.

Referring to FIG. 1, the microcomputer 31 is formed on a single semiconductor chip of single crystal silicon, for example, by using a CMOS (Complementary Metal Oxide Semiconductor) integrated circuit manufacturing technique, for example.

As illustrated in FIG. 1, the microcomputer 31 includes a central processing unit (CPU) 32, a random access memory (RAM) 35, and a flash memory module (FMDL) 36. The central processing unit 32 includes an instruction control unit and an executing unit, and executes an instruction. The random access memory 35 is used as a work area of the central processing unit 32, for example. The flash memory module 36 is provided as a nonvolatile memory module that stores data, a program, and the like.

The microcomputer 31 further includes a direct memory access controller (DMAC) 33, a bus interface circuit (BIF) 34, a flash sequencer (FSQC) 37, external input/output ports (PRT) 38 and 39, a timer (TMR) 40, a clock pulse generator (CPG) 41, a high-speed bus (HBUS) 42, and a peripheral bus (PBUS) 43.

The bus interface circuit 34 controls a bus interface or a bus bridge between the high-speed bus 42 and the peripheral bus 43. The flash sequencer 37 performs command access control for the flash memory module (FMDL) 36. The clock pulse generator 41 generates an internal clock CLK for controlling the microcomputer 31.

The bus configuration of the microcomputer 31 is not specifically limited. In the case of FIG. 1, the high-speed bus (HBUS) 42 and the peripheral bus (PBUS) 43 are provided. Each of the high-speed bus 42 and the peripheral bus 43 is not specifically limited, but includes a data bus, an address bus, and a control bus. By providing two buses, that is, the high-speed bus 42 and the peripheral bus 43, it is possible to reduce a load on a bus as compared with a case where all circuits are coupled to a single common bus, thereby ensuring a high-speed access operation.

To the high-speed bus 42 are coupled the central processing unit 32, the direct memory access controller 33, the bus interface circuit 34, the random access memory 35, and the flash memory module 36. To the peripheral bus 43 are coupled the flash sequencer 37, the external input/output ports 38 and 39, the timer 40, and the clock pulse generator 41.

The microcomputer 31 further includes a clock terminal XTAL to which an oscillator is coupled, a clock terminal EXTAL to which an external clock is supplied, an external hardware standby terminal STBY that instructs a standby state, and an external reset terminal RES that instructs reset. The microcomputer 31 further includes terminals that receive a power-supply voltage VDD for a digital circuit, a power-supply voltage VCC for an analog circuit, and a ground voltage VSS (also referred to as a reference voltage VSS), respectively.

Because the flash sequencer 37 and the flash memory module 36 configured in an array as a logic circuit are designed by separate CAD tools from each other, they are illustrated as separate circuit blocks in FIG. 1 for convenience. However, they configure one flash memory 46 together.

The flash memory module 36 is coupled to the high-speed bus (HBUS) 42 via a read-only high-speed access port (HACSP) 45. The central processing unit 32 or the direct memory access controller 33 can make read access to the flash memory module 36 from the high-speed bus 42 via the high-speed access port 45. When making write access and initialization access to the flash memory module 36, the central processing unit 32 or the direct memory access controller 33 issues a command to the flash sequencer 37 via the bus interface circuit 34 by way of the peripheral bus (PBUS) 43. In response to this command, the flash sequencer 37 controls initialization of the flash memory module and a write operation from the peripheral bus (PBUS) via a low-speed access port (LACSP) 44.

[Flash Memory Module]

Figure 2:
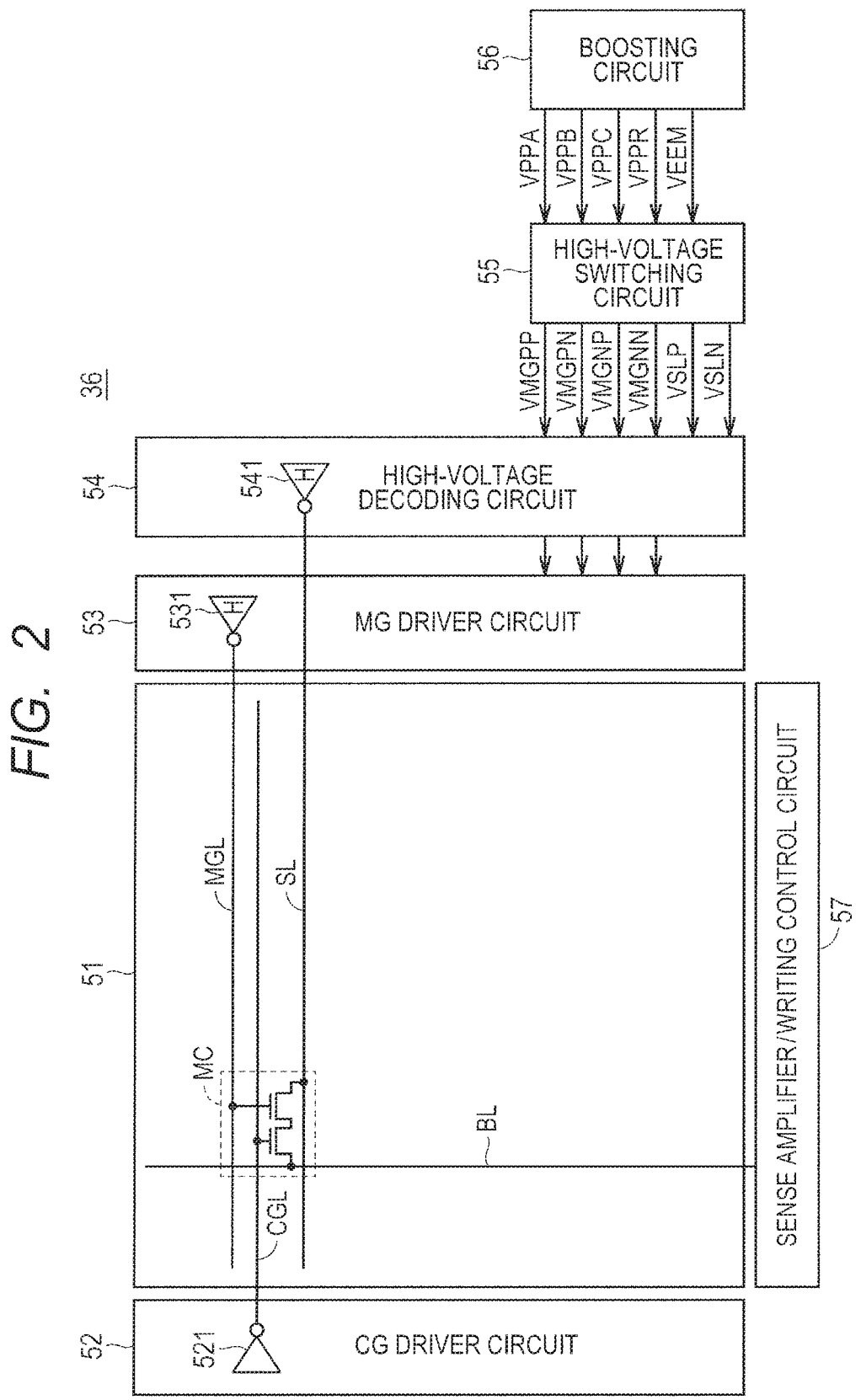
FIG. 2 is a block diagram illustrating a configuration of a flash memory module (FMDL) in FIG. 1.

FIG. 2 is a block diagram illustrating a configuration of the flash memory module (FMDL) in FIG. 1.

The flash memory module 36 includes a memory cell array 51, a CG driver circuit 52, an MG driver circuit 53, a high-voltage decoding circuit 54, a high-voltage switching circuit 55, a boosting circuit 56, a sense amplifier/writing control circuit 57.

The memory cell array 51 includes a plurality of memory cells MC arranged in a matrix. FIG. 2 only illustrates a typical one of the memory cells MC. In the present disclosure, a MONOS (Metal-Oxide-Nitride-Oxide-Silicon) type memory cell MC is described as an example as illustrated in FIGS. 2, 3A to 3D, and 4A to 4D. However, the technique of the present disclosure can be also applied to a memory cell MC having another configuration, for example, a floating-gate type. The detailed configuration of a MONOS type memory cell MC will be described with reference to FIGS. 3A to 3D.

The memory cell array 51 further includes a plurality of memory gate lines MGL, a plurality of control gate lines CGL, and a plurality of source lines SL, provided as control signal lines for the memory cells MC to correspond to respective rows of the memory cells MC, and a plurality of bit lines BL provided to correspond to respective columns of the memory cells MC. FIG. 2 illustrates typical control signal lines that are coupled to one memory cell MC.

The CG driver circuit 52 includes a plurality of drivers 521 each of which generates a control gate (CG) signal to drive a corresponding control gate line CGL.

The MG driver circuit 53 includes a plurality of drivers 531 each of which generates a memory gate (MG) signal to drive a corresponding memory gate lines MGL.

The boosting circuit 56 includes a charge pump circuit therein, and generates various boosted voltages and supplies a boosted voltage to the high-voltage decoding circuit 54. Specifically, the boosting circuit 56 generates a positive voltage VPPA for a writing MG, a positive voltage VPPC for a write-unselected MG, a positive voltage VPPB for a writing SL, a breakdown-voltage relaxing positive voltage VPPR, and a negative voltage VEEM for an erasing MG.

Hereinafter, the positive voltage VPPA for a writing MG may be referred to as a high power-supply voltage VPPA, the positive voltage VPPC for a write-unselected MG may be referred as a medium voltage VPPC, and the breakdown-voltage relaxing positive voltage VPPR may be referred to as a medium voltage VPPR. The medium voltage VPPC and the medium voltage VPPR are between the high power-supply voltage VPPA and the ground voltage VSS. In addition, in the following embodiment, the medium voltage VPPR is set to a voltage value between the high power-supply voltage VPPA and the medium voltage VPPC.

The high-voltage switching circuit 55 selects various boosted voltages generated by the boosting circuit 56 to generate a voltage VMGPP for an MG on a high-potential side in a selected block, a voltage VMGPN for an MG on a low-potential side in a selected block, a voltage VMGNP for an MG on a high-potential side in an unselected block, a voltage VMGNN for an MG on a low-potential side in an unselected block, a selected SL voltage VSLP, and a voltage VSLN for an unselected SL. The high-voltage switching circuit 55 supplies the generated voltage to the high-voltage decoding circuit 54 as a decoder power-supply voltage.

The high-voltage decoding circuit 54 supplies a high voltage to the MG driver circuit 53 and the source line SL. More specifically, the high-voltage decoding circuit 54 uses the decoder power-supply voltage generated by the high-voltage switching circuit 55 to supply a decode signal to the MG driver circuit 53 and to generate a source-line signal to be supplied to the source line SL.

The sense amplifier/writing control circuit 57 reads the content stored in a selected memory cell via a bit line BL, and write the content to be stored into a selected memory cell via a bit line BL.

[Supply Voltage to Memory Cell]

Next, the description is provided for an example of voltages supplied from the CG driver circuit 52, the MG driver circuit 53, the high-voltage decoding circuit 54, and the sense amplifier/writing control circuit 57 described above to a selected/unselected memory cell in a selected/unselected block. Values in this specification, for example, in FIGS. 3A to 3D and 4A to 4D, are an example for explanation. Voltages are not limited to these values.

(Example of Voltages Applied to Memory Cell in Data Writing)

FIGS. 3A to 3D illustrate an example of voltages applied to a memory cell in data writing in a table format.

First, referring to FIG. 3A, a configuration of a MONOS type nonvolatile memory cell MC is briefly described. The memory cell MC includes a control gate (CG) 61, a silicon nitride film 62, a memory gate (MG) 63, a source 64, and a drain 65. The control gate 61 is formed over a surface of a P-type silicon substrate 60 via an insulating layer (not illustrated). The silicon nitride film 62 is formed over sidewalls of the control gate 61 as an ONO (Oxide-Nitride-Oxide) film formed of a silicon oxide film (not illustrated), the silicon nitride film 62, and a silicon oxide film (not illustrated). The memory gate 63 having a sidewall structure is formed over the ONO film. The source 64 and the drain 65 are formed by implantation of N-type impurity into both sides of the gates 61 and 63, respectively. The source 64 is coupled to a corresponding source line SL and the drain 65 is coupled to a corresponding bit line BL.

Next, a voltage applied to a memory cell MC in data writing is described. An electrode to which a high voltage that requires breakdown-voltage relaxation is applied is the memory gate MG. Therefore, the following description focuses on a voltage applied to the memory gate MG.

For a selected memory cell in a selected block illustrated in FIG. 3A, a voltage applied to a selected memory gate MG is VMGPP, and VPPA is selected as VMGPP in writing. As an example, VPPA is a voltage of about 6.4 to 11 [V].

For an unselected memory cell in a selected block illustrated in FIG. 3B, a voltage applied to an unselected memory gate MG is VMGPN, and VPPC is selected as VMGPN in writing. As an example, VPPC is a voltage of about 3.5 [V].

For a selected memory cell in an unselected block illustrated in FIG. 3C, a voltage applied to a selected memory gate MG is VMGNP, and VPPC is selected as VMGNP in writing. As an example, VPPC is a voltage of about 3.5 [V].

For an unselected memory cell in an unselected block illustrated in FIG. 3D, a voltage applied to an unselected memory gate MG is VMGNN, and VDD is selected as VMGNN in writing. As an example, VDD is a voltage of about 1.5 [V].

(Example of Voltage Applied to Memory Cell in Data Erasing)

FIGS. 4A to 4D illustrate an example of voltages applied to a memory cell in data erasing in a table format. An electrode to which a negative high voltage that requires breakdown-voltage relaxation is applied is the memory gate MG. Therefore, the following description focuses on a voltage to be applied to the memory gate MG.

For a selected memory cell in a selected block illustrated in FIG. 4A, a voltage applied to a selected memory gate MG in erasing is VMGPN, and VEEM is selected as VMGPN in erasing. As an example, VEEM is a voltage of about −3.3 to −8 [V].

For an unselected memory cell in a selected block illustrated in FIG. 4B, a voltage applied to an unselected memory gate MG in erasing is VMGPP, and VDD is selected as VMGPP in erasing. As an example, VDD is a voltage of about 1.5 [V].

A state of a selected memory cell in an unselected block illustrated in FIG. 4C does not exist in erasing. Therefore, in erasing, the voltage VMGNP that is common is applied to all memory gate GM in an unselected block, as illustrated in FIG. 4D. In erasing, VDD is selected as VMGNP. As an example, VDD is a voltage of about 1.5 [V]

[High-Voltage Switching Circuit]

FIGS. 5A to 5D illustrate a specific configuration example of a high-voltage switching circuit in FIG. 2.

Figure 5A:
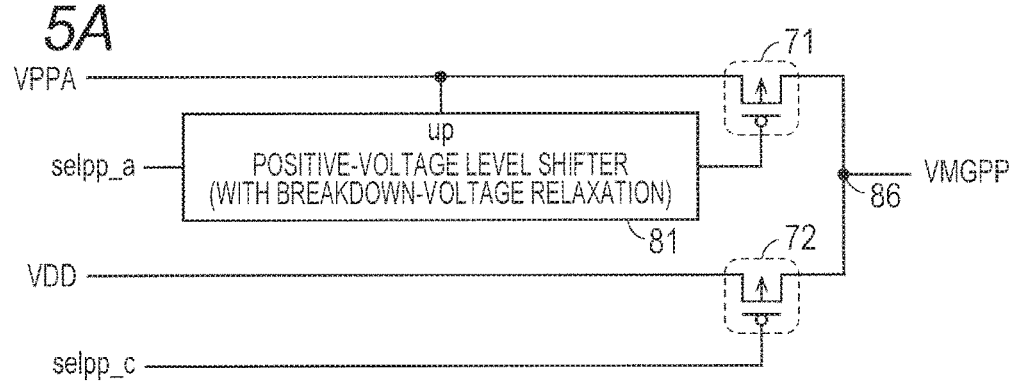
FIGS. 5A to 5D illustrate a specific configuration example of a high-voltage switching circuit in FIG. 2.

FIG. 5A illustrates a circuit that generates the voltage VMGPP. To an output node 86 of the voltage VMGPP, the voltage VPPA is supplied via a switch 71, and the voltage VDD is supplied via a switch 72. Either of the voltage VPPA and the voltage VDD is selected depending on an operation mode.

As each of the switches 71 and 72, a single or multiple stage PMOS transistor is used. FIG. 5A illustrates each of the switches 71 and 72 by a single stage PMOS transistor for simplicity. However, if necessary for the reason of breakdown voltage, a multiple stage PMOS transistor can be used or a MOS transistor for relaxing a breakdown voltage can be inserted. Similarly, as each of switches 73 to 78 described later, a multiple stage MOS transistor can be used or a MOS transistor for relaxing a breakdown voltage can be inserted, if necessary for the reason of breakdown voltage.

The switches 71 and 72 are controlled to be turned on/off by selecting signals selpp_a and selpp_c both at a VDD level, respectively. A level shifter is not required for the selecting signal selpp_c. The selecting signal selpp_c at a VDD level is directly input to the gate of the PMOS transistor configuring the switch 72.

Meanwhile, the VDD-level selecting signal selpp_a is converted to a VPPA-level signal by a positive-voltage level shifter 81. The VPPA-level selecting signal selpp_a is input to the gate of the PMOS transistor configuring the switch 71. The voltage VPPA is input to a terminal up of the positive-voltage level shifter 81. Because the voltage VPPA is a high voltage, the positive-voltage level shifter 81 requires breakdown relaxation.

Figure 5B:
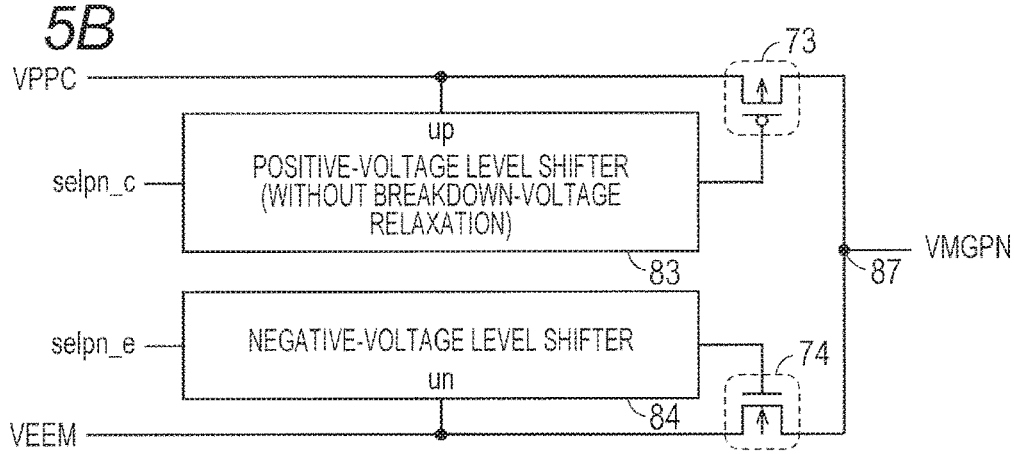

FIG. 5B illustrates a circuit that generates the voltage VMGPN. To an output node 87 of the voltage VMGPN, the voltage VPPC is supplied via a switch 73, and the voltage VEEM is supplied via a switch 74. Either of the voltage VPPC and the voltage VEEM is selected depending on an operation mode. As the switch 73, a single or multiple stage PMOS transistor is used. As the switch 74, a single or multiple stage NMOS transistor is used.

Turning on/off of the switch 73 is controlled by a selecting signal selpn_c. The selecting signal selpn_c that is at a VDD level is converted to a VPPC-level signal by a positive-voltage level shifter 83. The VPPC-level selecting signal selpp_c is input to the gate of the PMOS transistor configuring the switch 73. The voltage VPPC is input to a terminal up of the positive-voltage level shifter 83. Because the voltage VPPC is not a high voltage, the positive-voltage level shifter 83 does not require breakdown voltage relaxation.

Turning on/off of the switch 74 is controlled by a selecting signal selpn_e at a VDD level. The VDD-level selecting signal selpn_e is converted to a VEEM-level signal by a negative-voltage level shifter 84. The VEEM-level selecting signal selpn_e is input to the gate of the NMOS transistor configuring the switch 74. The voltage VEEM is input to a terminal un of the negative-voltage level shifter 84.

Figure 5C:
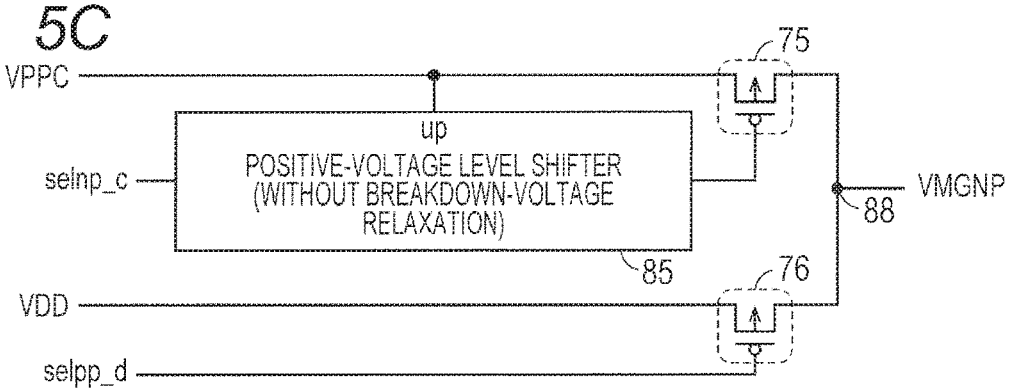

FIG. 5C illustrates a circuit that generates the voltage VMGNP. To an output node 88 of the voltage VMGNP, the voltage VPPC is supplied via a switch 75, and the voltage VDD is supplied via a switch 76. Either of the voltage VPPC and the voltage VDD is selected depending on an operation mode. As each of the switches 75 and 76, a single or multiple stage PMOS transistor is used.

The switches 75 and 76 are controlled to be turned on/off by VDD-level selecting signals selnp_c and selpp_d, respectively. A level shifter is not required for the selecting signal selpp_d. The VDD-level selecting signal selpp_d is directly input to the gate of the PMOS transistor configuring the switch 76.

The VDD-level selecting signal selpn_c is converted to a VPPC-level signal by a positive-voltage level shifter 85. The VPPC-level selecting signal selnp_c is input to the gate of the PMOS transistor configuring the switch 75. The voltage VPPC is input to a terminal up of the positive-voltage level shifter 85. Because the voltage VPPC is not a high voltage, the positive-voltage level shifter 85 does not require breakdown voltage relaxation.

Figure 5D:
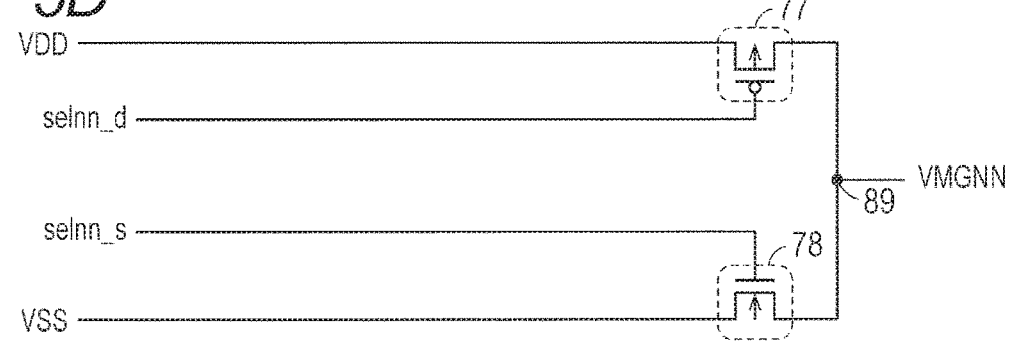

FIG. 5D illustrates a circuit that generates the voltage VMGNN. To an output node 89 of the voltage VMGNN, the voltage VDD is supplied via a switch 77, and the voltage VSS is supplied via a switch 78. Either of the voltage VDD and the voltage VSS is selected depending on an operation mode. As the switch 77, a single or multiple stage PMOS transistor is used. As the switch 78, a single or multiple stage NMOS transistor is used.

The switches 77 and 78 are controlled to be turned on/off by VDD-level selecting signals selnn_d and selnn_s, respectively. For both the selecting signals selnn_d and selnn_s, no level shifter is required. The selecting signal selnn_d is directly input to the gate of the PMOS transistor configuring the switch 77, and the selecting signal selnn_s is directly input to the gate of the NMOS transistor configuring the switch 78.

Table 1 shows an example of boosted voltages selected by the high-voltage switching circuit in FIG. 2.

TABLE 1

Example of selection of boosted voltage
by high-voltage switching circuit

| | Write state | Erase state |
|---|---|---|
| VMGPP | VPPA | VDD |
| VMGPN | VPPC | VEEN |
| VMGNP | VPPC | VDD |
| VMGNN | VDD | VSS |

As shown in Table 1, the high-voltage switching circuit 55 selects, as the output voltage VMGPP, VPPA in writing and VDD in erasing. As the output voltage VMGPN, the high-voltage switching circuit 55 selects VPPC in writing and VEEM in erasing. As the output voltage VMGNP, the high-voltage switching circuit 55 selects VPPC in writing and VDD in erasing. As the output voltage VMGNN, the high-voltage switching circuit 55 selects VDD in writing and VSS in erasing.

An additional switch may be provided in the high-voltage switching circuit 55 to deal with a verifying mode and a test mode that are operation modes other than writing and erasing.

As illustrated in FIGS. 5A to 5D, the level shifters 81 and 83 to 85 are required for configuring the high-voltage switching circuit 55 in FIG. 2. Among those level shifters, breakdown-voltage relaxation has to be considered for the positive-voltage level shifter 81. The reason is as follows. In writing, a high voltage of 11 V class, for example, is used as the voltage VPPA applied to the memory gate MG. However, the breakdown voltage of a MOS transistor configuring the positive-voltage level shifter 81 is up to about 10 V, even if that transistor is for a high breakdown voltage type. Therefore, it is necessary to prevent application of the high power-supply voltage VPPA to each MOS transistor configuring the positive-voltage level shifter 81 as it is, by breakdown-voltage relaxation.

Further, because the voltage VEEM is a negative high voltage of about −8V, the voltage VEEM has to be applied to the gate of the switching NMOS transistor 74 for allowing a VDD/VEEM-level signal to pass therethrough, in order to turn off the NMOS transistor 74. Therefore, the negative-voltage level shifter 84 has to deal with the negative high voltage VEEM.

[Overall Configuration of Negative-Voltage Level Shifter]

Figure 6:
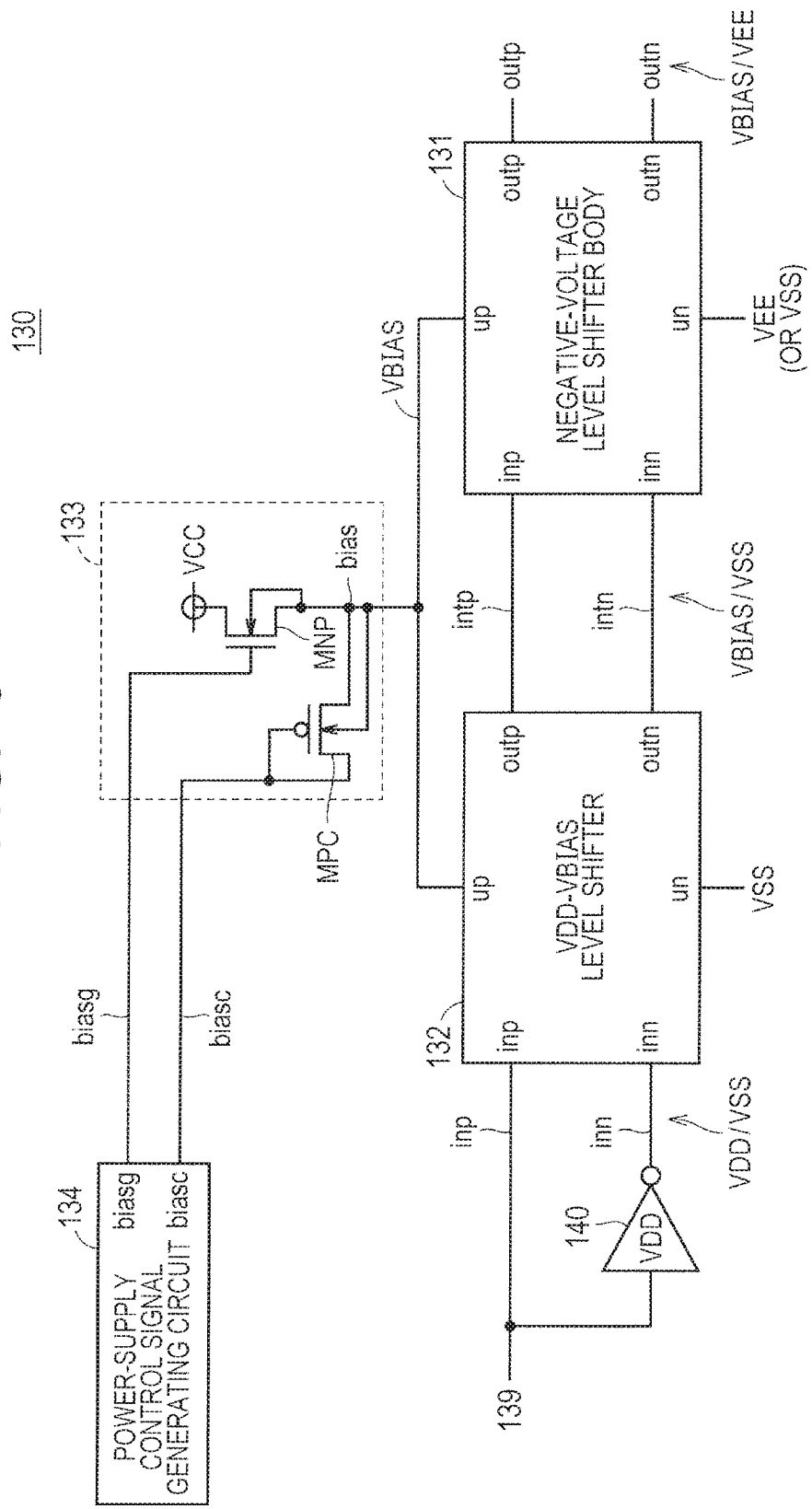
FIG. 6 is a block diagram illustrating a configuration of a negative-voltage level shifter in the semiconductor device according to the first embodiment.

FIG. 6 is a block diagram illustrating a configuration of a negative-voltage level shifter in the semiconductor device according to the first embodiment. A negative-voltage level shifter 130 in FIG. 6 can be applied to the negative-voltage level shifter 84 in FIG. 5B.

Referring to FIG. 6, the negative-voltage level shifter 130 includes a VDD−VBIAS level shifter 132, the negative-voltage level shifter body 131, a medium-voltage generating circuit 133 that generates a medium voltage VBIAS, a power-supply control signal generating circuit 134, and an inverter 140 that operates with the low power-supply voltage VDD.

The VDD−VBIAS level shifter 132 receives VDD/VSS-level signals inp and inn that are complementary, and converts a high level of the input signals inp and inn into the medium voltage VBIAS that is higher than the low power-supply voltage VDD and is lower than the medium power-supply voltage VCC. The input signal inn corresponds to a signal obtained by inverting a logic level of the input signal inp by the inverter 140, for example. The VDD−VBIAS level shifter 132 outputs VBIAS/VSS-level output signals outp and outn as input signals intp and intn of the subsequent stage.

A positive power-supply node up of the VDD−VBIAS level shifter 132 is coupled to a power-supply node bias of the medium-voltage generating circuit 133, thereby receiving the medium voltage VBIAS from the medium-voltage generating circuit 133. A negative power-supply node un of the VDD−VBIAS level shifter 132 receives the ground voltage VSS.

The negative-voltage level shifter body 131 converts a low level of the VBIAS/VDD-level input signals intp and intn output from the VDD−VBIAS level shifter 132 into a negative high voltage VEE. The negative-voltage level shifter body 131 outputs VBIAS/VEE-level output signals outp and outn to a circuit in the subsequent stage.

A positive power-supply node up of the negative-voltage level shifter body 131 is coupled to the node bias of the medium-voltage generating circuit 133, thereby receiving the medium voltage VBIAS from the medium-voltage generating circuit 133. A negative power-supply node un of the negative-voltage level shifter body 131 receives the negative high voltage VEE. When a negative high-voltage power supply is inactive, the ground voltage VSS is input to the negative power-supply node un. In FIG. 6, "VEE (or VSS)" means that the voltage of the negative power-supply node un is VEE when the negative high-voltage power supply is active, and is VSS when the negative high-voltage power supply is inactive. This is the same also in the other drawings.

The medium-voltage generating circuit 133 includes an NMOS transistor MNP and a PMOS transistor MPC.

The NMOS transistor MNP is configured as a source follower. Specifically, the drain of the NMOS transistor MNP is coupled to a node to which the medium power-supply voltage VCC is supplied (hereinafter, referred to as a "VCC node"). The source and the back gate of the NMOS transistor MNP are coupled to the power-supply node bias. To the gate of the NMOS transistor MNP, a control signal biasg is supplied from the power-supply control signal generating circuit 134.

The PMOS transistor MPC is coupled in diode connection, and is used as a clamping circuit that prevents the potential at the power-supply node bias from rising too high. The source and the back gate of the PMOS transistor MPC are coupled to the power-supply node bias. To the gate of the PMOS transistor MPC, a control signal biasc is supplied from the power-supply control signal generating circuit 134. The PMOS transistor MPC is used as a path for discharging electric charges of the power-supply node bias.

The power-supply control signal generating circuit 134 generates the control signals biasg and biasc. The detailed configuration and an operation of the power-supply control signal generating circuit 134 will be described later.

[Configuration Example of Negative-Voltage Level Shifter Body and Operation Thereof]

Figure 7:
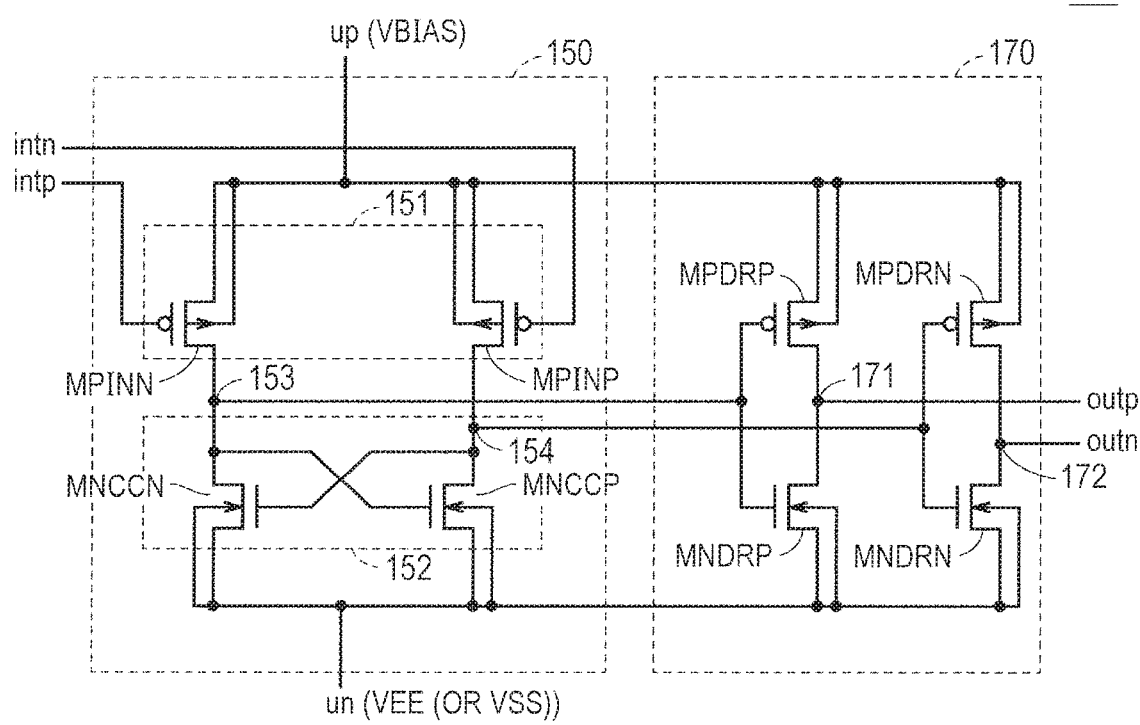
FIG. 7 is a circuit diagram illustrating a configuration example of a negative-voltage level shifter body in FIG. 6.

FIG. 7 is a circuit diagram illustrating a configuration example of the negative-voltage level shifter body in FIG. 6. The configuration of the negative-voltage level shifter body 131 in FIG. 7 is approximately the same as the configuration of a conventional negative-voltage level shifter without breakdown-voltage relaxation, except that the medium voltage VBIAS is supplied to the positive power-supply node up in place of the low power-supply voltage VDD.

Specifically, the negative-voltage level shifter body 131 in FIG. 7 includes a cross-coupled level shifter stage 150 and a driver stage 170. The level shifter stage 150 includes an input circuit 151 to which the complementary input signals intp and intn are input, and a latch circuit 152.

The input circuit 151 includes a pair of input PMOS transistors MPINP and MPINN. The sources and the back gates of the input PMOS transistors MPINP and MPINN are coupled to the positive power-supply node up.

The latch circuit 152 includes a pair of cross-coupled NMOS transistors MNCCP and MNCCN. The sources and the back gates of the NMOS transistors MNCCP and MNCCN are coupled to the negative power-supply node un. The gates and the drains of the NMOS transistors MNCCP and MNCCN are cross-coupled. That is, the gate of the NMOS transistor MNCCP and the drain of the NMOS transistor MNCCN are coupled to each other, and the drain of the NMOS transistor MNCCP and the gate of the NMOS transistor MNCCN are coupled to each other.

The drain of the input PMOS transistor MPINP and the drain of the cross-coupled NMOS transistor MNCCP are coupled to each other via an output node 154. The drain of the input PMOS transistor MPINN and the drain of the cross-coupled NMOS transistor MNCCN are coupled to each other via an output node 153.

The driver stage 170 includes driver PMOS transistors MPDRP and MPDRN and driver NMOS transistors MNDRP and MNDRN.

The sources of the driver PMOS transistors MPDRP and MPDRN are coupled to the positive power-supply node up, and the gates are coupled to the output nodes 153 and 154, respectively. Complementary output signals outp and outn are output from the drains of the driver PMOS transistors MPDRP and MPDRN, respectively. The sources of the driver NMOS transistors MNDRP and MNDRN are coupled to the negative power-supply node un, and the gates are coupled to the output nodes 153 and 154, respectively. The drains of the driver NMOS transistors MNDRP and MNDRN are respectively coupled to the driver PMOS transistors MPDRP and MPDRN.

Next, an operation of the above-described negative-voltage level shifter body 131 is briefly described. In response to the complementary input signals intp and intn that are at a VBIAS/VSS level, one of the input PMOS transistors MPINP and MPINN is turned on and the other is turned off. For example, assuming that the input PMOS transistor MPINP is turned on, the potential at the gate of the cross-coupled NMOS transistor MNCCN is pulled up, and therefore the cross-coupled NMOS transistor MNCCN is turned on. As a result, the voltage of the output node 153 becomes the negative high voltage VEE, and the voltage of the output node 154 becomes the medium voltage VBIAS. Thus, the driver PMOS transistor MPDRP and the driver NMOS transistor MNDRN are turned on, so that the output signal outp is placed at a high level (the medium voltage VBIAS) and the output signal outn is placed at a low level (the negative high voltage VEE).

[Another Configuration Example of Negative-Voltage Level Shifter Body and Operation Thereof]

Figure 8:
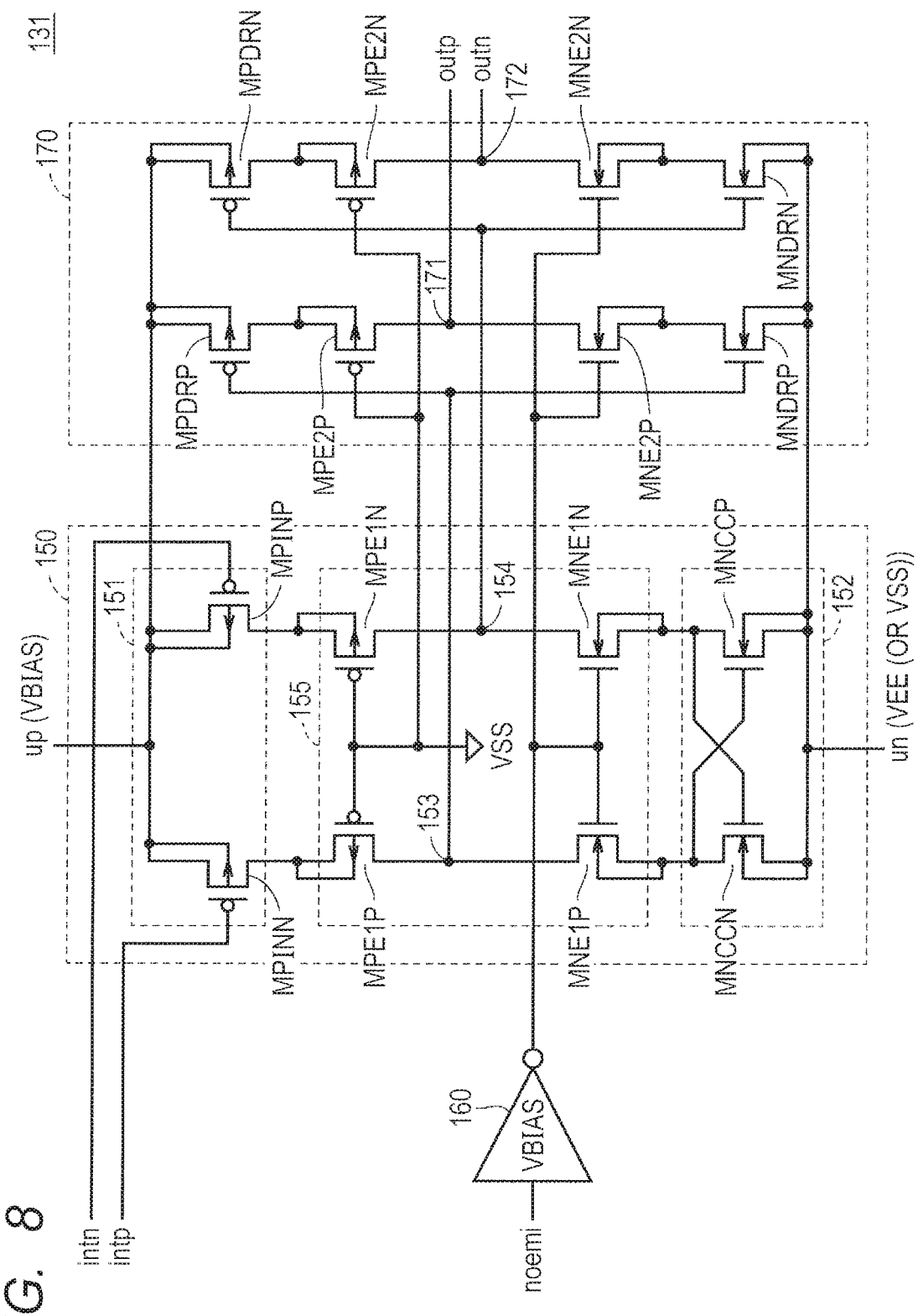
FIG. 8 is a circuit diagram illustrating another configuration example of the negative-voltage level shifter body.

FIG. 8 is a circuit diagram illustrating another configuration example of the negative-voltage level shifter body. The level shifter stage 150 in FIG. 8 is different from the level shifter stage 150 in FIG. 7 in that a breakdown-voltage relaxing circuit 155 is added between the input circuit 151 and the latch circuit 152 and a level shifter 160 is added.

The breakdown-voltage relaxing circuit 155 includes breakdown-voltage relaxing PMOS transistors MPE1P and MPE1N and breakdown-voltage relaxing NMOS transistors MNE1P and MNE1N. The breakdown-voltage relaxing PMOS transistor MPE1P and the breakdown-voltage relaxing NMOS transistor MNE1P are coupled in series between the drain of the input PMOS transistor MPINN and the drain of the cross-coupled NMOS transistor MNCCN in that order. Similarly, the breakdown-voltage relaxing PMOS transistor MPE1N and the breakdown-voltage relaxing NMOS transistor MNE1N are coupled in series between the drain of the input PMOS transistor MPINP and the drain of the cross-coupled NMOS transistor MNCCP in that order.

To the gates of the breakdown-voltage relaxing PMOS transistors MPE1P and MPE1N, the ground voltage VSS is supplied. Each of the back gates is coupled to the respective sources. To the gates of the breakdown-voltage relaxing NMOS transistors MNE1P and MNE1N, a signal obtained by inverting a logic level of a breakdown-voltage relaxation control signal noemi by the level shifter 160 is supplied. The back gates are coupled to the respective sources.

More specifically, the breakdown-voltage relaxation control signal noemi is obtained by conversion of a VDD/VSS-level signal to a VBIAS/VSS-level signal by the level shifter 160. This is because, when an input high level of the breakdown-voltage relaxation control signal noemi is VDD, excessively low VDD prevents an operation of the breakdown-voltage relaxing NMOS transistors MNE1P and MNE1N.

The breakdown-voltage relaxation control signal noemi is at a high level (the low power-supply voltage VDD) when a negative high-voltage power supply is active (that is, breakdown-voltage relaxation is effective), and is at a low level (the ground voltage VSS) when the negative high-voltage power supply is inactive.

Therefore, to the gates of the breakdown-voltage MNOS transistors MNE1P and MNE1N, the ground voltage VSS is applied when the negative high-voltage power supply is active, and the medium voltage VBIAS is applied when the negative high-voltage power supply is inactive.

The driver stage 170 in FIG. 8 is different from the driver stage 170 in FIG. 7 in that the former one further includes breakdown-voltage relaxing PMOS transistors MPE2P and MPE2N and breakdown-voltage relaxing NMOS transistors MNE2P and MNE2N. The breakdown-voltage relaxing PMOS transistor MPE2P and the breakdown-voltage relaxing NMOS transistor MNE2P are coupled in series between the drain of the driver PMOS transistor MPDRP and the drain of the driver NMOS transistor MNDRP in that order. Similarly, the breakdown-voltage relaxing PMOS transistor MPE2N and the breakdown-voltage relaxing NMOS transistor MNE2N are coupled in series between the drain of the driver PMOS transistor MPDRN and the drain of the driver NMOS transistor MNDRN in that order.

To the gates of the breakdown-voltage relaxing PMOS transistors MPE2P and MPE2N, the ground voltage VSS is supplied. To the gates of the breakdown-voltage relaxing NMOS transistors MNE2P and MNE2N is input the breakdown-voltage relaxation control signal noemi of which the logic level has been inverted and which has been converted to a VBIAS/VSS-level signal. The back gates of the breakdown-voltage relaxing PMOS transistors MPE2P and MPE2N are coupled to the respective sources. The back gates of the breakdown-voltage relaxing NMOS transistors MNE2P and MNE2N are coupled to the respective sources.

The output signal outp is output from a coupling node 171 between the drain of the breakdown-voltage relaxing PMOS transistor MPE2P and the drain of the breakdown-voltage relaxing NMOS transistor MNR2P. The output signal outn is output from a coupling node 172 between the drain of the breakdown-voltage relaxing PMOS transistor MPE2P and the drain of the breakdown-voltage relaxing NMOS transistor MNR2N.

An operation of the negative-voltage level shifter body 131 in FIG. 8 is basically the same as the negative-voltage level shifter body 131 in FIG. 7 except that a breakdown-voltage relaxing function is added.

Specifically, voltages applied to the input PMOS transistors MPINP and MPINN and the driver PMOS transistors MPDRP and MPDRN are limited to VBIAS–VSS. Voltages applied to the cross-coupled NMOS transistors MNCCP and MNCCN and the driver NMOS transistors MNDRP and MNDRN are limited to VSS–VEE when the negative-voltage level shifter body 131 is active, and is limited to VBIAS–VSS when the negative-voltage level shifter body 131 is inactive.

By the above-described configuration, it is possible to suppress damage of a gate oxide film in each of the input PMOS transistors MPINP and MPINN, the cross-coupled NMOS transistors MNCCP and MNCCN, the driver PMOS transistors MPDRP and MPDRN, and the driver NMOS transistors MNDRP and MNDRN, for example, because of FN (Fowler-Nordheim) deterioration or the like.

[Configuration Example of VDD–VBIAS Level Shifter and Operation Thereof]

Figure 9:
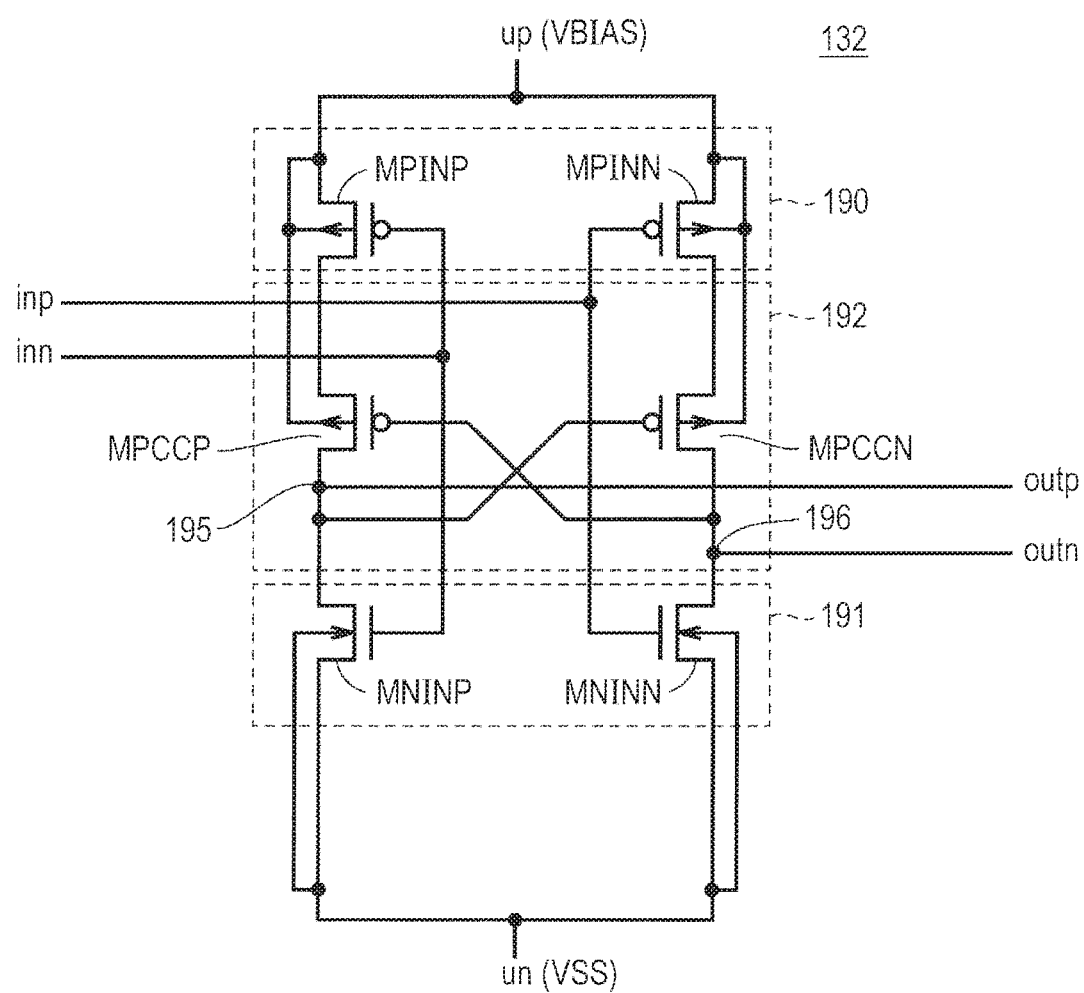
FIG. 9 is a circuit diagram illustrating a configuration example of a VDD-VBIAS level shifter in FIG. 6.

FIG. 9 is a circuit diagram illustrating a configuration example of the VDD–VBIAS level shifter in FIG. 6. When the medium voltage VBIAS to be applied to the positive power-supply node up is made too high, it is difficult to satisfy a breakdown-voltage condition of a MOS transistor configuring a level shifter. Therefore, a potential difference between the low power-supply voltage VDD and the medium voltage VBIAS is set to be relatively small. Accordingly, a cross-coupled level shifter as illustrated in FIG. 9 can be used as the VDD–VBIAS level shifter 132.

Referring to FIG. 9, the VDD–VBIAS level shifter 132 includes a pair of input PMOS transistors MPINP and MPINN (190), a pair of input NMOS transistors MNINP and MNINN (191), and a cross-coupled PMOS transistors MPCCP and MPCCN (192) provided between them.

The sources of the input PMOS transistors MPINP and MPINN are coupled to a positive power-supply node up, as illustrated in FIG. 9. The drains of the input PMOS transistors MPINP and MPINN are respectively coupled to the sources of the cross-coupled PMOS transistors MPCCP and MPCCN. The sources of the input NMOS transistors MNINP and MNINN are coupled to a negative power-supply node un. The drains of the input NMOS transistors MNINP and MNINN are respectively coupled to the drains of the cross-coupled PMOS transistors MPCCP and MPCCN. The back gates of the input PMOS transistors MPINP and MPINN and the cross-coupled PMOS transistors MPCCP and MPCCN are coupled to the positive power-supply node up. The back gates of the input NMOS transistors MNINP and MNINN are coupled to the negative power-supply node un.

The input signal inp is input to the gate of the input PMOS transistor MPINN and the gate of the input NMOS transistor MNINN. The input signal inn, which is complementary to the input signal inp, is input to the gate of the input PMOS transistor MPINP and the gate of the input NMOS transistor MNINP. The output signal outp is output from a coupling node 195 between the cross-coupled PMOS transistor MPCCP and the input NMOS transistor MNINP. The output signal outp, which is complementary to the output signal outp, is output from a coupling node 196 between the cross-coupled PMOS transistor MPCCN and the input NMOS transistor MNINN.

An operation of the negative-voltage level shifter body 131 configured as described above is briefly described. For example, it is assumed that the input signal inp is at a high level (the low power-supply voltage VDD) and the input signal inn is at a low level (the ground voltage VSS). Thus, the input NMOS transistor MNINN is on, the input NMOS transistor MNINP is off, and the input PMOS transistor MPINP is on. If the low power-supply voltage VDD is much lower than the medium voltage VBIAS, the input PMOS transistor MPINN is not completely turned off in some cases.

When the input NMOS transistor MNINN is turned on, the voltage of the coupling node 196 (the output signal outn) approximately becomes equal to the ground voltage VSS. Thus, electric charges in the gate of the PMOS transistor MPCCP are pulled out, so that the PMOS transistor MPCCP is turned on. As a result, the voltage of the coupling node 195 (the output signal outp) becomes approximately equal to the medium voltage VBIAS.

Further, when the voltage of the coupling node 195 becomes equal to the medium voltage VBIAS, the PMOS transistor MPCCN is turned off. As described above, by providing the cross-coupled PMOS transistors MPCCP and MPCCN, it is possible to prevent a through current between the positive power-supply node up and the negative power-supply node un.

[Configuration Example of Power-Supply Control Signal Generating Circuit]

Figure 10:
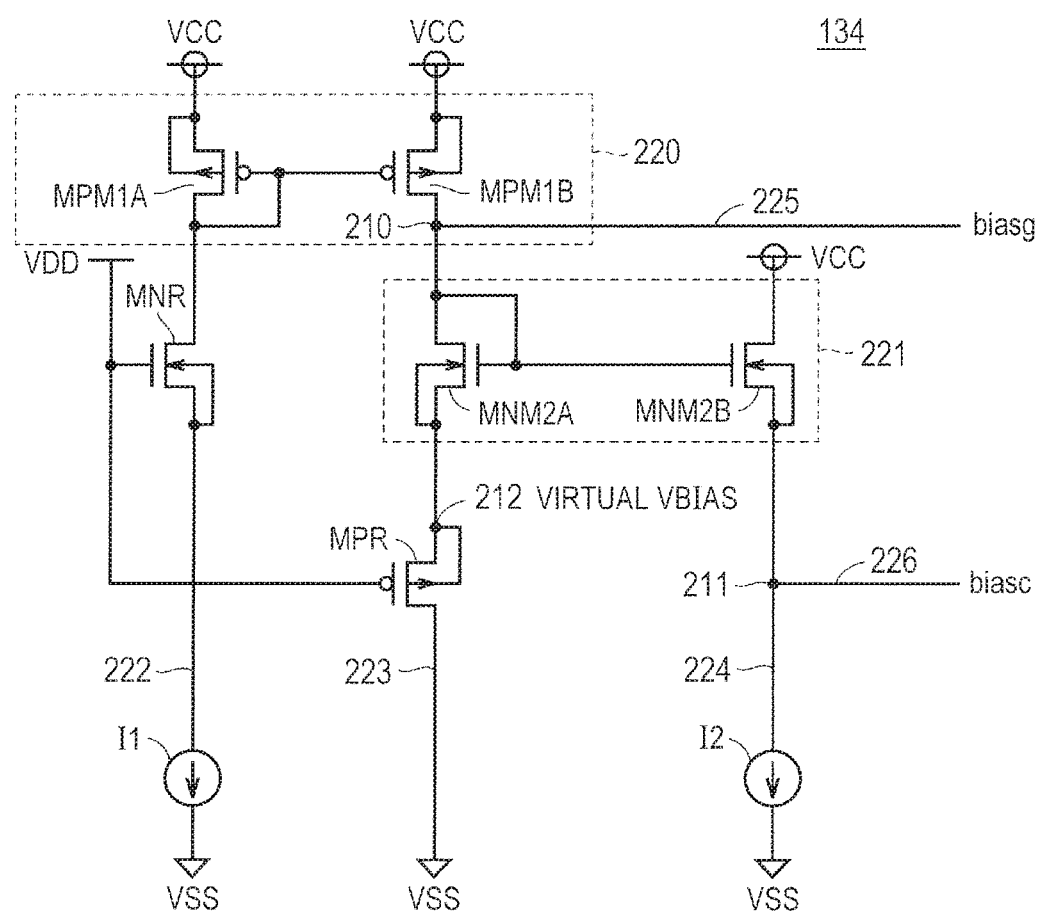
FIG. 10 is a circuit diagram illustrating a configuration example of a power-supply control signal generating circuit in FIG. 6.

FIG. 10 is a circuit diagram illustrating a configuration example of the power-supply control signal generating circuit in FIG. 6.

Referring to FIG. 10, the power-supply control signal generating circuit 134 includes PMOS transistors MPM1A and MPM1B configuring a current mirror circuit 220, NMOS transistors MNM2A and MNM2B configuring a current mirror circuit 221, an NMOS transistor MNR, a PMOS transistor MPR, and current supplies I1 and I2. First, coupling of these circuit components is described.

The sources of the PMOS transistors MPM1A and MPM1B configuring the current mirror circuit 220 are coupled to a VCC node. The gate of each of the PMOS transistors MPM1A and MPM1B is coupled to the drain of the PMOS transistors MPM1A. The back gates of the PMOS transistors MPM1A and MPM1B are respectively coupled to the sources thereof.

The NMOS transistor MNR and the current supply I1 are provided in series to each other on a current path 222 that couples the drain of the PMOS transistor MPM1A and a node to which the ground voltage VSS is supplied (hereinafter, referred to as a "VSS node") to each other. To the gate of the NMOS transistor MNR, the low power-supply voltage VDD is applied. The back gate of the NMOS transistor MNR is coupled to the source thereof. The NMOS transistor MNR is a replica of the input NMOS transistors MNINP and MNINN configuring the VDD–VBIAS level shifter 132.

The NMOS transistor MNM2A and the PMOS transistor MPR are provided in series to each other on a current path 223 that couples the drain of the PMOS transistor MPM1B and the VSS node to each other. To the gate of the PMOS transistor MPR, the low power-supply voltage VDD is applied. The back gates of the PMOS transistor MPR is coupled to the source thereof.

The NMOS transistors MNM2A and MNM2B are replicas of the source-follower NMOS transistor MNP in FIG. 6.

Further, the PMOS transistor MPR is a replica of the input PMOS transistors MPINP and MPINN configuring the VDD–VBIAS level shifter 132 in FIG. 9. However, as described later, the size (the gate width) of the PMOS transistor MPR is formed to be several times to about 10 times the sizes of the input PMOS transistors MPINP and MPINN (when a mirror ratio of the current mirror circuit 220 is 1:1).

The NMOS transistor MNM2B configures the current mirror circuit 221 together with the NMOS transistor MNM2A. The gate of the NMOS transistor MNM2B is coupled to the gate and the drain of the NMOS transistor MNM2A. The drain of the NMOS transistor MNM2B is coupled to the VCC node. The back gates of the NMOS transistors MNM2A and MNM2B are respectively coupled to the sources thereof. The current supply I2 is provided on a current path 224 that couples the source of the NMOS transistor MNM2B and the VSS node to each other.

A coupling node 210 between the PMOS transistor MPM1B and NMOS transistor MNM2A is coupled to the gate of the NMOS transistor MNP provided in the medium-voltage generating circuit 133 in FIG. 6, via a signal line 225. Thus, the control signal biasg is supplied to the gate of the NMOS transistor MNP. A coupling node 211 between the NMOS transistor MNM2B and the current supply I2 is coupled to the gate of the PMOS transistor MPC provided in the medium-voltage generating circuit 133 in FIG. 6, via a signal line 226. Thus, the control signal biasc is supplied to the gate of the PMOS transistor MPC.

[Operation of Power-Supply Control Signal Generating Circuit]

An operation of the power-supply control signal generating circuit 134 in FIG. 10 is described below. First, the outline of the operation is described.

The power-supply control signal generating circuit 134 adjusts a current value of the replica NMOS transistor MNR and a current value of the replica PMOS transistor MPR when the low power-supply voltage VDD is applied to the gate of each transistor MNR or MPR by use of a current mirror circuit. The current values in this case are determined to values at which the VDD–VBIAS level shifter 132 stably operates with respect to a VDD/VSS-level input signal. In this state, the power-supply control signal generating circuit 134 outputs a gate voltage of the replica PMOS transistor MNM2A as the control signal biasg, and outputs a source voltage of the replica NMOS transistor MNM2A as the control signal biasc.

Next, referring to FIGS. 6, 9, and 10, an operation of the power-supply control signal generating circuit 134 is described in more detail, in association with an operation of the medium-voltage generating circuit 133 in FIG. 6.

(Function of PMOS Transistor MPC in Medium-Voltage Generating Circuit in FIG. 6)

Referring to FIG. 6, the power-supply node bias of the medium-voltage generating circuit 133 is coupled to the positive power-supply node up of the VDD–VBIAS level shifter 132 and the positive power-supply node up of the negative-voltage level shifter 131 body. Here, each of the VDD–VBIAS level shifter 132 and the negative-voltage level shifter body 131 does not cause current consumption basically, as long as it performs an inverting operation. Therefore, to prevent leakage in the NMOS transistor MNP from causing excessive rise of the medium voltage VBIAS of the power-supply node bias, a current flows in a direction from the power-supply node bias to the power-supply control signal generating circuit 134 via the clamping PMOS transistor MPC when VBIAS>biasc. Therefore, the medium voltage VBIAS of the power-supply node bias is not allowed to rise to a predetermined value or more.

(How to Set Medium Voltage VBIAS)

The medium voltage VBIAS is set to allow the VDD–VBIAS level shifter 132 to stably operate. Specifically, in the example of the VDD–VBIAS level shifter 132 illustrated in FIG. 9, the VDD–VBIAS level shifter 132 stably operates when a current value when the low power-supply voltage VDD is applied to the gates of the input NMOS transistors MNINP and MNINN is considerably larger than a current value when the low power-supply voltage VDD is applied to the input PMOS transistors MPINP and MPINN, for example, when the former current value is several times to ten times the latter current value or more. As described above, whereas the input signals inp and inn are VDD/VSS-level signals, a voltage applied to the positive power-supply node up is the medium voltage VBIAS and is higher than the low power-supply voltage VDD. Therefore, the input PMOS transistors MPINP and MPINN are not completely turned off.

Here, a drain current increases depending on a gate-to-source voltage. Therefore, the above-described condition can be replaced with a condition of the gate-to-source voltage. When the low power-supply voltage VDD is applied to the gates of the input NMOS transistors MNINP and MNINN, a gate-to-source voltage Vgs is VDD. Meanwhile, when the low power-supply voltage VDD is applied to the gate of the input NMOS transistors MNINP and MNINN, an absolute value of the gate-to-source voltage |Vgs is VBIAS–VDD. Therefore, the medium voltage VBIAS is selected to satisfy $$VDD >> VBIAS - VDD \qquad (1).$$

(How to Set Control Signal Biasg)

The power-supply control signal generating circuit 134 illustrated in FIG. 10 has a feature in that it uses the NMOS transistor MNP that is a replica of the input NMOS transistors MNINP and MNINN of the VDD–VBIAS level shifter 132 in FIG. 9, and uses the PMOS transistor MPR that is a replica of the input PMOS transistors MPINP and MPINN.

While the low power-supply voltage VDD is applied to the gate of the replica NMOS transistor MNR and the gate of the replica PMOS transistor MPR, a current equivalent to a current flowing in the replica NMOS transistor MNR is made to flow in the replica PMOS transistor MPR by using the current mirror circuit 220. Therefore, the voltage of a node 212 that is a source terminal of the PMOS transistor MPR is converged to a value equivalent to the medium voltage VBIAS (hereinafter, referred to as virtual VBIAS).

The NMOS transistor MNM2A that is coupled in diode connection in FIG. 10 is a replica of the NMOS transistor MNP configuring the medium-voltage generating circuit 133 in FIG. 6. Therefore, the gate voltage of the replica NMOS transistor MNM2A, that is, a voltage higher than the virtual VBIAS that is the voltage of the node 212 by a threshold voltage Vth_N of the replica NMOS transistor MNM2A (virtual VBIAS+Vth_N) is input to the gate of the NMOS transistor MNP as the control signal biasg.

Here, as a stable-operating condition of the VDD–VBIAS level shifter 132 illustrated in FIG. 9, it is assumed that an on-current of the input NMOS transistor MNINP or MNINN when the low power-supply voltage VDD is applied to the gate thereof is 10 times an on-current of the input PMOS transistor MPINP or MPINN when the low power-supply voltage VDD is applied to the gate thereof. In this case, the size of the replica NMOS transistor MNP is formed to be equivalent to the sizes of the input NMOS transistors MNINP and MNINN. Meanwhile, the size of the replica PMOS transistor MPR is formed to be 10 times the sizes of the input PMOS transistors MPINP and MPINN. The mirror ratio of the current mirror circuit 220 is set to 1:1.

Alternatively, the size of the replica PMOS transistor MPR can be formed to be equivalent to the sizes of the input PMOS transistors MPINP and MPINN. In this case, the mirror ratio of the current mirror circuit 220 is set to 10:1 (that is, the size of the PMOS transistor MPM1A is formed to be 10 times the size of the PMOS transistor MPM1B).

The current supply I1 coupled between the source of the replica NMOS transistor MNR and the VSS node is for limiting a current to achieve low power consumption. That is, under an operation condition where the low power-supply voltage VDD is high and/or an operating condition where a threshold voltage of the NMOS transistor MNR is low, the current supply I1 is provided for preventing large increase of an on-current of the NMOS transistor MNR. Virtual VBIAS is converged into a voltage value corresponding to a current value of this current supply I1.

(How to Set Control Signal Biasc)

The control signal biasc is set as a source potential of the NMOS transistor MNM2B that is a replica of the NMOS transistor MNP in FIG. 6. To the gate of the NMOS transistor MN2B, the control signal biasg is supplied.

Further, the current supply I2 is coupled between the source of the NMOS transistor MNM2B and the VSS node. Therefore, because a current flows in a direction from the power-supply node bias in FIG. 6 to the VSS node because of the current supply I2, the voltage of the power-supply node bias in FIG. 6 cannot rise excessively even if a leak current flows in the NMOS transistor MNP in FIG. 6. Thus, the medium voltage VBIAS applied to the positive power-supply node up of the VDD–VBIAS level shifter 132 in FIG. 6 and the positive power-supply node up of the negative-voltage level shifter body 131 is clamped.

[Advantageous Effect of First Embodiment]

As described above, according to the first embodiment, the VDD–VBIAS level shifter 132 for converting the VDD/VSS-level input signals inp and inn to VBIAS/VSS-level signals is added in the previous stage of the negative-voltage level shifter body 131. Because a high level of the input signals intp and intn of the negative-voltage level shifter body 131 is pulled up from the low power-supply voltage VDD to the medium voltage VBIAS by the VDD–VBIAS level shifter 132 in the previous stage, it is possible to allow the negative-voltage level shifter 130 to stably operate even if the value of the low power-supply voltage VDD is low.

Further, a power-supply voltage applied to the positive power-supply node up of the negative-voltage level shifter body 131 is also changed from the low power-supply voltage VDD to the medium voltage VBIAS. Therefore, a high level of the output signals outp and outn also rise to the medium voltage VBIAS. As a result, it is possible to surely control and turn on/off a switching NMOS transistor that receives this output signal outp or outn at its gate.

To generate the medium voltage VBIAS that satisfies VBIAS>VDD, the medium-voltage generating circuit 133 is provided. Further, the power-supply control signal generating circuit 134 is provided, which is for generating the control signals biasg and biasc to be supplied to this medium-voltage generating circuit 133 is provided.

The power-supply control signal generating circuit 134 includes the PMOS transistor MPR that is a replica of the input PMOS transistors MPINP and MPINN of the VDD–VBIAS level shifter 132 and the NMOS transistor MNR that is a replica of the input NMOS transistors MNINP and MNINN. By using the current mirror circuit 220, an appropriate bias current is made to flow in these replica MOS transistors MPR and MNR. The bias current value in this case is set to allow the VDD–VBIAS level shifter 132 to stably operate. As a result, the medium voltage VBIAS is automatically determined, and the control signal biasg is determined in accordance with a value of this medium voltage VBIAS.

Further, the PMOS transistor MPC is provided for preventing excessive rise of a voltage of the power-supply node bias because of leakage in the NMOS transistor MNP in the medium-voltage generating circuit 133 in FIG. 6 while the negative-voltage level shifter body 131 and the VDD–VBIAS level shifter 132 are not performing an inverting operation. In the power-supply control signal generating circuit 134, the NMOS transistor MNM2B is provided which is a replica of this PMOS transistor MPR. By the current supply I2 coupled to the source of the NMOS transistor MNM2B, excessive increase of the voltage of the power-supply node bias is prevented. The control signal biasc supplied to the medium-voltage generating circuit 133 is pulled out from the source of the NMOS transistor MNM2B.

[Modification of First Embodiment]

In the medium-voltage generating circuit 133 in FIG. 6, the drain of the clamping PMOS transistor MPC is coupled to the gate thereof, and the control signal biasc is supplied to that drain as with the gate. However, a clamped potential at the power-supply node bias is determined by a gate potential of the PMOS transistor MPC. Therefore, it suffices that a drain potential is lower than the gate potential. A modification considering this point is illustrated in FIG. 11.

Figure 11:
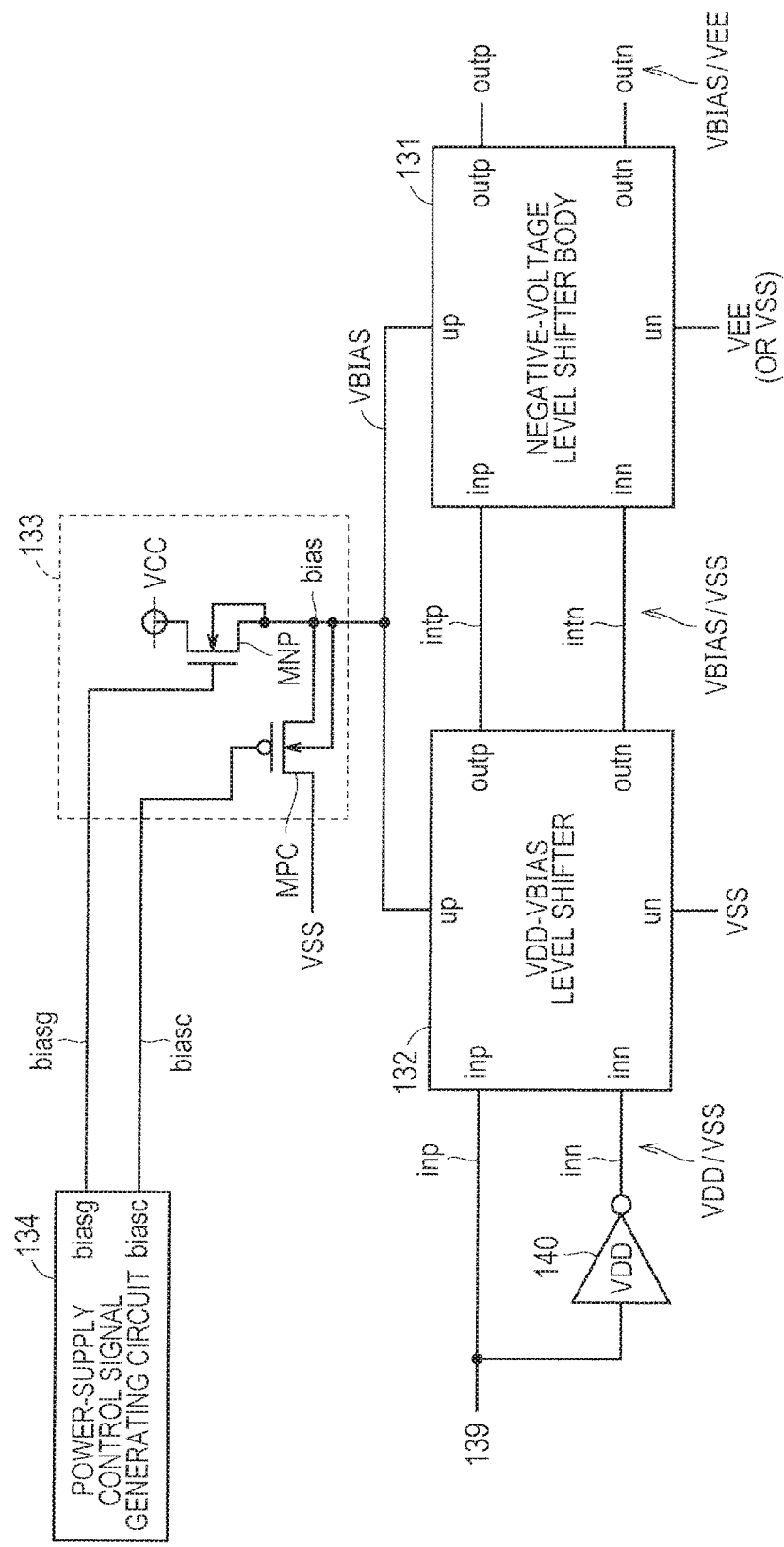
FIG. 11 illustrates a configuration example of a negative-voltage level shifter according to a modification of FIG. 6.

FIG. 11 illustrates a configuration of a negative-voltage level shifter according to a modification of FIG. 6. A negative-voltage level shifter 130A in FIG. 11 is different from the negative-voltage level shifter 130 in FIG. 6 in that the drain of the PMOS transistor MPC provided in the medium-voltage generating circuit 133 is coupled to the VSS node. The other points in FIG. 11 are the same as those in FIG. 6. Therefore, the same or corresponding portions are labeled with the same reference sign, and the description thereof is not repeated.

Although the drain voltage of the PMOS transistor MPC is the ground voltage VSS in FIG. 11, the drain voltage can be any voltage as long as it is lower than the voltage value of the control signal biasc and is stable. For example, the drain voltage of the PMOS transistor MPC can be set to the low power-supply voltage VDD.

Further, the change in FIG. 11 can be also applied to second to sixth embodiments described later.

Second Embodiment

In the first embodiment, to the positive power-supply node up of the negative-voltage level shifter body 131 and the positive power-supply node up of the VDD–VBIAS level shifter 132 in the previous stage, the common medium voltage VBIAS is supplied from the common medium-voltage generating circuit 133. This is because it is necessary to make a high level of the input signal intp and intn of the negative-voltage level shifter body 131 and the medium voltage VBIAS supplied to the positive power-supply node up the same.

However, because the two level shifters 131 and 132 are different in both an operation timing and a current consumption, a fluctuation of a power-supply voltage by one of the level shifters may affect an operation of the other level shifter by making a power supply common. The second embodiment presents a configuration for solving this problem.

[Configuration of Negative-Voltage Level Shifter]

Figure 12:
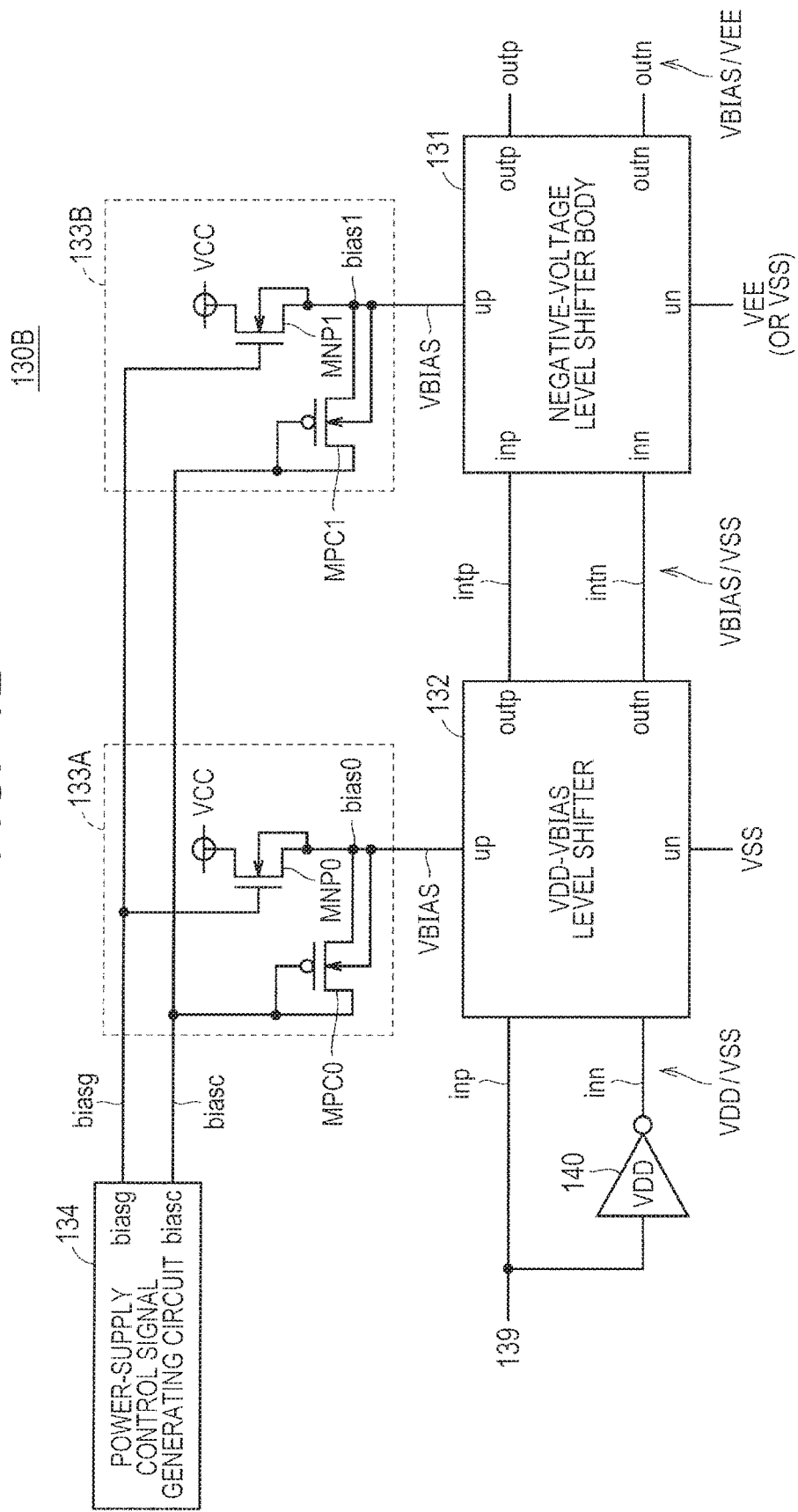
FIG. 12 illustrates a configuration of a negative-voltage level shifter in a semiconductor device according to a second embodiment.

FIG. 12 illustrates a configuration of a negative-voltage level shifter in a semiconductor device according to the second embodiment.

Referring to FIG. 12, a negative-voltage level shifter 130B in FIG. 12 is different from the negative-voltage level shifter 130 in FIG. 6 in that the medium-voltage generating circuit 133 is divided into a medium-voltage generating circuit 133A for the VDD–VBIAS level shifter 132 in the previous stage and a medium-voltage generating circuit 133B for the negative-voltage level shifter body 131 in the subsequent stage.

The configuration of each of the medium-voltage generating circuits 133A and 133B is the same as the medium-voltage generating circuit in FIG. 6. Specifically, the medium-voltage generating circuit 133A includes a power-supply node bias0, an NMOS transistor MNP0, and a PMOS transistor MPC0. The power-supply node bias0, the NMOS transistor MNP0, and the PMOS transistor MPC0 respectively correspond to the power-supply node bias, the NMOS transistor MNP, and the PMOS transistor MPC in the medium-voltage generating circuit 133 in FIG. 6. Similarly, the medium-voltage generating circuit 133B includes a power-supply node bias1, an NMOS transistor MNP1, and a PMOS transistor MPC1. The power-supply node bias1, the NMOS transistor MNP1, and the PMOS transistor MPC1 respectively correspond to the power-supply node bias, the NMOS transistor MNP, and the PMOS transistor MPC in the medium-voltage generating circuit 133 in FIG. 6.

In FIG. 12, the power-supply control signal generating circuit 134 is provided in common to the medium-voltage generating circuits 133A and 133B. Specifically, the power-supply control signal generating circuit 134 supplies the common control signal biasg to the gate of the NMOS transistor MNP0 of the medium-voltage generating circuit 133A and the gate of the NMOS transistor MNP1 of the medium-voltage generating circuit 133B. The power-supply control signal generating circuit 134 supplies the common control signal biasc to the gate of the PMOS transistor MPC0 of the medium-voltage generating circuit 133A and the gate of the PMOS transistor MPC1 of the medium-voltage generating circuit 133B.

The other points in FIG. 12 are the same as those in FIG. 6. Therefore, the same or corresponding portions are labeled with the same reference sign, and the description thereof is not repeated.

[Operation of Negative-Voltage Level Shifter]

The medium-voltage generating circuit 133A and the medium-voltage generating circuit 133B are different from each other only in the size of an internal MOS transistor, but are the same in the circuit configuration. Therefore, the voltage of the power-supply node bias0 of the medium-voltage generating circuit 133A and the voltage of the power-supply node bias1 of the medium-voltage generating circuit 133B are the same in terms of a DC voltage. However, a difference occurs between a voltage drop of the power-supply node bias0 when the VDD–VBIAS level shifter 132 performs an inverting operation and a voltage drop of the power-supply node bias1 when the negative-voltage level shifter body 131 performs an inverting operation.

In general, the negative-voltage level shifter body 131 in the subsequent stage consumes a current more largely than the VDD–VBIAS level shifter 132 in the previous stage. Therefore, when both the level shifters 131 and 132 share a common power supply, it is likely that the voltage drop of the power-supply node bias1 in association with an operation of the negative-voltage level shifter body 131 in the subsequent stage reaches the power-supply node bias0 of the VDD–VBIAS level shifter 132 in the previous stage, affecting an operation of the VDD–VBIAS level shifter 132 in the previous stage.

In the case of the second embodiment, the power-supply node bias0 and the power-supply node 1 are separated from each other, and therefore reaching of the voltage drop described above does not occur.

[Advantageous Effect of Second Embodiment]

As described above, according to the second embodiment, the medium-voltage generating circuit 133A for the VDD–VBIAS level shifter 132 in the previous stage and the medium-voltage generating circuit 133B for the negative-voltage level shifter body 131 are separately provided from each other. Therefore, the power-supply node bias0 for the VDD–VBIAS level shifter 132 and the power-supply node bias 1 for t the negative-voltage level shifter body 131 are separated from each other. Thus, power-supply noise caused by an inverting operation of one of the level shifters does not reach the power-supply node of the other level shifter, enabling a stable inverting operation of the level shifter.

Further, because of a large difference in current consumption between the VDD–VBIAS level shifter 132 and the negative-voltage level shifter body 131, it is possible to set an appropriate size of a MOS transistor in accordance with current consumption of a corresponding level shifter in a corresponding one of the medium-voltage generating circuits 133A and 13B.

Third Embodiment

The first and second embodiments are based on that the voltage of the positive power-supply node up of the negative-voltage level shifter body 131 and the voltage of the positive power-supply node up of the VDD–VBIAS level shifter 132 in the previous stage are at the same level. However, both the voltages are not necessarily at the same level. This is because, as for the negative-voltage level shifter body 131, it is possible to completely turn off the input PMOS transistors MPINP and MPINN as a high level of the input signals intp and intn is higher than the voltage level of the positive power-supply node up. The third embodiment describes an example where the power-supply voltage for the negative-voltage level shifter body 131 and the power-supply voltage for the VDD–VBIAS level shifter 132 in the previous stage are set at different levels.

[Configuration of Negative-Voltage Level Shifter]

Figure 13:
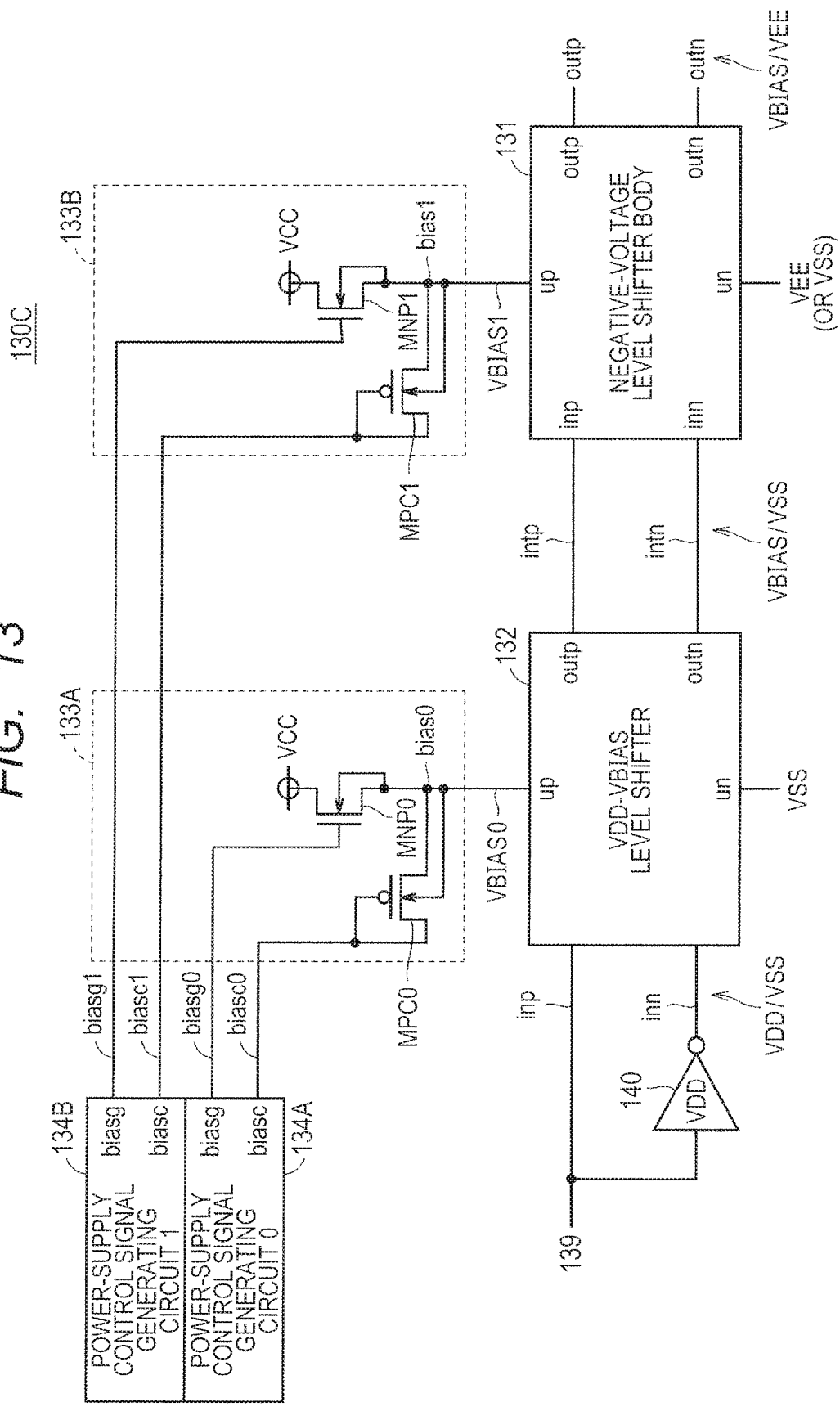
FIG. 13 illustrates a configuration of a negative-voltage level shifter in a semiconductor device according to a third embodiment.

FIG. 13 illustrates a configuration of a negative-voltage level shifter in a semiconductor device according to a third embodiment.

Referring to FIG. 13, a negative-voltage level shifter 130C in FIG. 13 is different from the negative-voltage level shifter 130B in FIG. 12 in that the power-supply control signal generating circuit 134 is divided into a power-supply control signal generating circuit 0 (134A) for the VDD–VBIAS level shifter 132 in the previous stage and a power-supply control signal generating circuit 1 (134B) for the negative-voltage level shifter body 131 in the subsequent stage. Therefore, the power-supply control signal generating circuit 0 (134A) supplies control signals biasc0 and biasg0 to the medium-voltage generating circuit 133A. The power-supply control signal generating circuit 1 (134B) supplies control signals biasc1 and biasg1 to the medium-voltage generating circuit 133B independently of the power-supply control signal generating circuit 0 (134A).

By the above-described configuration, it is possible to make values of the control signals biasc0 and biasg0 different from values of control signals biasc1 and biasg1. As a result, it is possible make a medium voltage VBIAS0 supplied to the positive power-supply node up of the VDD–VBIAS level shifter 132 in the previous stage and a medium voltage VBIAS1 supplied to the positive power-supply node up of the negative-voltage level shifter body 131 different from each other. However, VBIAS0>VBIAS1 has to be satisfied.

The other points in FIG. 13 are the same as those in FIG. 12. Therefore, the same or corresponding portions are labeled with the same reference sign, and the description thereof is not repeated.

[Advantageous Effect of Third Embodiment]

By employing the configuration in FIG. 13, when the medium voltage VBIAS0 determined from a viewpoint of a stable operation of the VDD–VBIAS level shifter 132 in the previous stage is too high from a viewpoint of breakdown voltage of the negative-voltage level shifter body 131, it is possible to set the medium voltage VBIAS1 supplied to the negative-voltage level shifter body 131 to satisfy VBIAS1<VBIAS0. Thus, it is possible to reduce the maximum voltage VBIAS1–VEE applied to a MOS transistor in the negative-voltage level shifter 131 body.

Fourth Embodiment

The first to third embodiments are based on that a voltage applied to the positive power-supply node up of the negative-voltage level shifter body 131 is the medium voltage VBIAS that is higher than the low power-supply voltage VDD. However, as a load driven by a negative-voltage level shifter is larger, it is necessary to make the size of a MOS transistor used in the medium-voltage generating circuit 133 that generates the medium voltage VBIAS larger, which is disadvantageous in terms of an area.

The fourth embodiment describes that, by limiting a use condition of a negative-voltage level shifter, a voltage applied to the positive power-supply node up of the negative-voltage level shifter body 131 can be returned to the low power-supply voltage VDD supplied from outside.

[Overall Configuration of Negative-Voltage Level Shifter]

Figure 14:
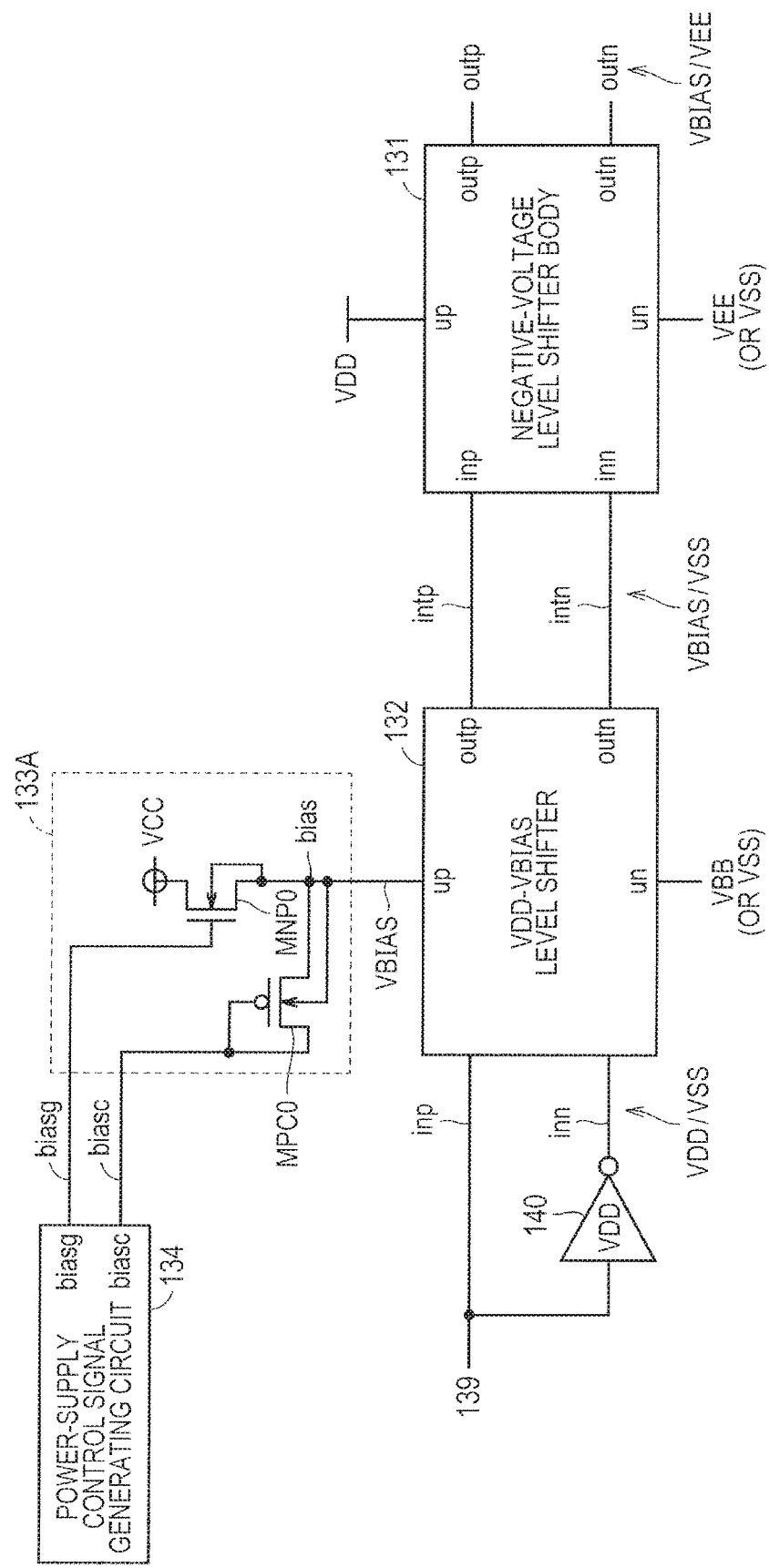
FIG. 14 illustrates a configuration of a negative-voltage level shifter in a semiconductor device according to a fourth embodiment.

FIG. 14 illustrates a configuration of a negative-voltage level shifter in a semiconductor device according to a fourth embodiment.

Referring to FIG. 14, a negative-voltage level shifter 130D in FIG. 14 is different from the negative-voltage level shifter 130B in FIG. 12 in that the medium-voltage generating circuit 133B for the negative-voltage level shifter body 131 is removed and in place of that, the low power-supply voltage VDD is supplied to the positive power-supply node up of the negative-voltage level shifter body 131.

Further, in the case of the fourth embodiment, a portion of the configuration of the VDD–VBIAS level shifter 132 is changed. The reason why a disadvantage occurs in the configuration of the VDD–VBIAS level shifter 132 described in the first to third embodiments is as follows.

A driving ability of a PMOS transistor for receiving the input signal intp or intn, provided in the negative-voltage level shifter body 131 (for example, the input PMOS transistors MPINP and MPINN in FIG. 7) depends on an absolute value |Vgs| of the gate-to-source voltage Vgs. Specifically,

|Vgs|=voltage of positive power-supply node up−lower-limit voltage of input signal intp or intn    (2).

In the case of the first to third embodiments, the lower-limit voltage of the input signals intp and inpn (that is, a low level) is the ground voltage VSS. Therefore, when the voltage of the positive power-supply node up is set to the low power-supply voltage VDD, the absolute value |Vgs| of the gate-to-source voltage is VDD–VSS. Therefore, as the low power-supply voltage VDD is lower, the driving capability of the input PMOS transistor cannot be sufficiently obtained, so that the input PMOS transistor may not operate normally. To solve this problem, in the first to third embodiments, the gate-to-source voltage |Vgs of the input PMOS transistor is increased by setting an applied voltage of the positive power-supply node up to the medium voltage VBIAS (>VDD).

In the fourth embodiment, the voltage of the positive power-supply node up cannot be changed to a voltage other than the low power-supply voltage VDD. Therefore, the lower-limit voltage of the input signals intp and intn is changed to VBB lower than the ground voltage VSS to solve the above-described problem. Here, VBB is considered as being at a negative voltage level that is shallower than −1 V. Therefore, the VDD–VBIAS level shifter 132 in the previous stage converts the VDD/VSS-level input signals inp and inn to VBIAS/VBB-level signals. To the positive power-supply node up of the VDD/VBIAS level shifter 132, the medium voltage VBIAS is applied. To the negative power-supply node un thereof, the shallow negative voltage VBB is applied. When a power supply that generates the shallow negative voltage VBB is inactive, the voltage of the negative power-supply node un is the ground voltage VSS.

Thus, the input signals intp and intn of the negative-voltage level shifter body 131 are VBIAS/VBB-level signals. Therefore, even if a voltage applied to the positive power-supply node up is the low power-supply voltage VDD, it is possible to allow the negative-voltage level shifter body 131 to stably operate.

[Configuration Example of VDD–VBIAS Level Shifter]

Figure 15:
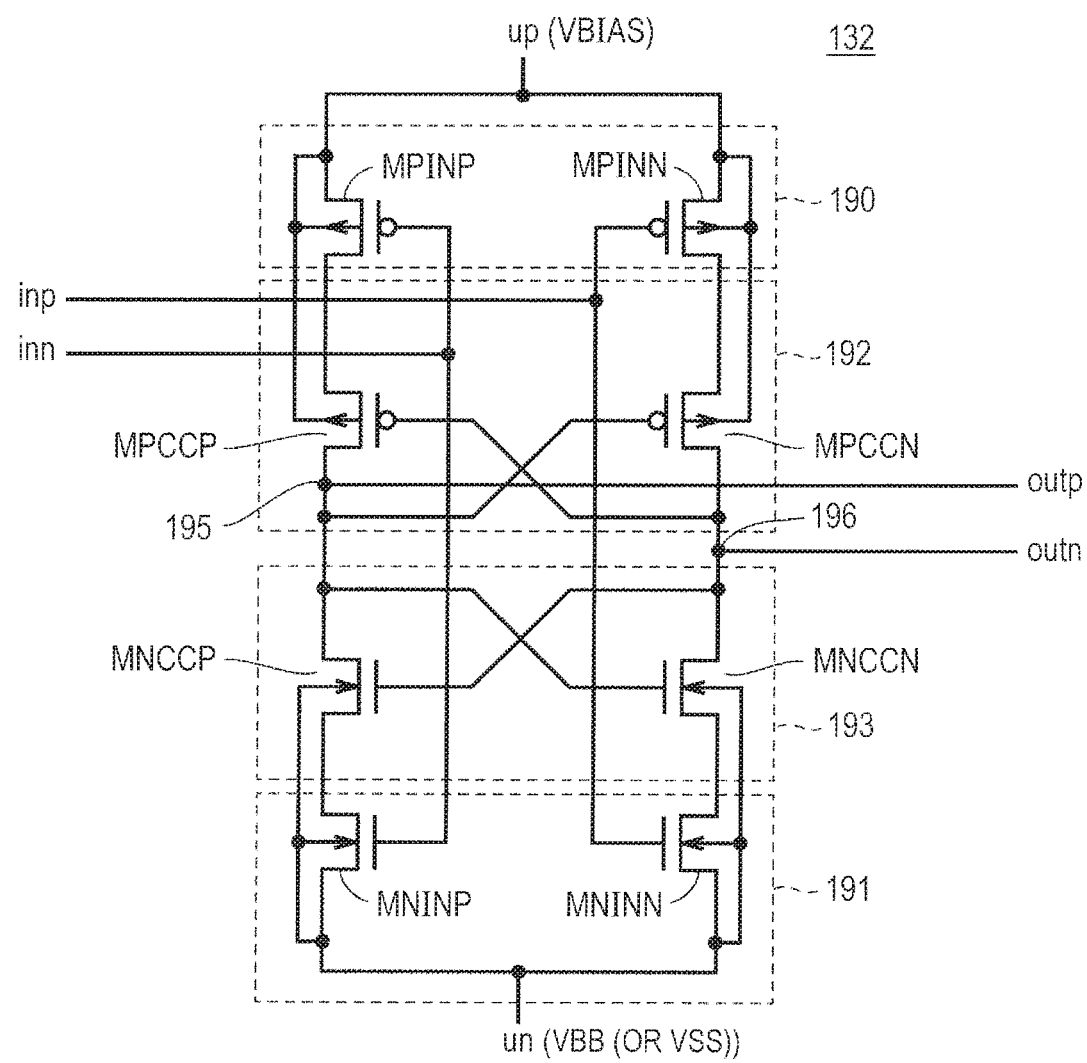
FIG. 15 is a circuit diagram illustrating a configuration example of a VDD-VBIAS level shifter in FIG. 14.

FIG. 15 is a circuit diagram illustrating a configuration example of the VDD–VBIAS level shifter in FIG. 14. The VDD–VBIAS level shifter 132 in FIG. 15 is different from the VDD–VBIAS level shifter 132 in FIG. 9 in that the former one further includes cross-coupled NMOS transistors MNCCP and MNCCN (193) between the cross-coupled PMOS transistors MPCCP and MPCCN (192) and the input NMOS transistors MNINP and MNINN (191).

Specifically, the cross-coupled NMOS transistor MNCCP is coupled between the PMOS transistor MPCCP and the input NMOS transistor MNINP in series thereto. The cross-coupled NMOS transistor MNCCN is coupled between the PMOS transistor MPCCN and the input NMOS transistor MNINN in series thereto. The gates and the drains of the cross-coupled NMOS transistors MNCCP and MNCCN are cross-coupled. The back gates of the cross-coupled NMOS transistors MNCCP and MNCCN are coupled to the negative power-supply node un.

The output signal outp is output from the coupling node 195 between the PMOS transistor MPCCP and the cross-coupled NMOS transistor MNCCP. The output signal outn is output from the coupling node 196 between the PMOS transistor MPCCN and the cross-coupled NMOS transistor MNCCN.

In the above-described configuration, the cross-coupled NMOS transistors MNCCP and MNCCN are necessary for preventing a through current from flowing between the positive power-supply node up and the negative power-supply node un. Because a voltage applied to the negative power-supply node un is set to the negative voltage VBB that is shallower than the ground voltage VSS, a voltage of VSS–VBB is applied across the gate and the source of each input NMOS transistor MNINP or MNINN even when the input signal inp or inn is at a low level (the ground voltage VSS). Therefore, the input NMOS transistor MNINP or MNINN may not be completely turned off. On the other hand, a voltage across the gate and the source of one of the cross-coupled NMOS transistors MNCCP and MNCCN becomes 0 V. Therefore, a through current can be prevented.

[Configuration Example of Negative-Voltage Level Shifter Body]

The negative-voltage level shifter body 131 without breakdown-voltage relaxation illustrated in FIG. 7 can be used in the negative-voltage level shifter 130D in FIG. 14 without any change. Meanwhile, the negative-voltage level shifter body 131 with breakdown-voltage relaxation illustrated in FIG. 8 has to be partly changed in order to be used in the negative-voltage level shifter 130D in FIG. 14. The required change is described below with reference to the drawings.

Figure 16:
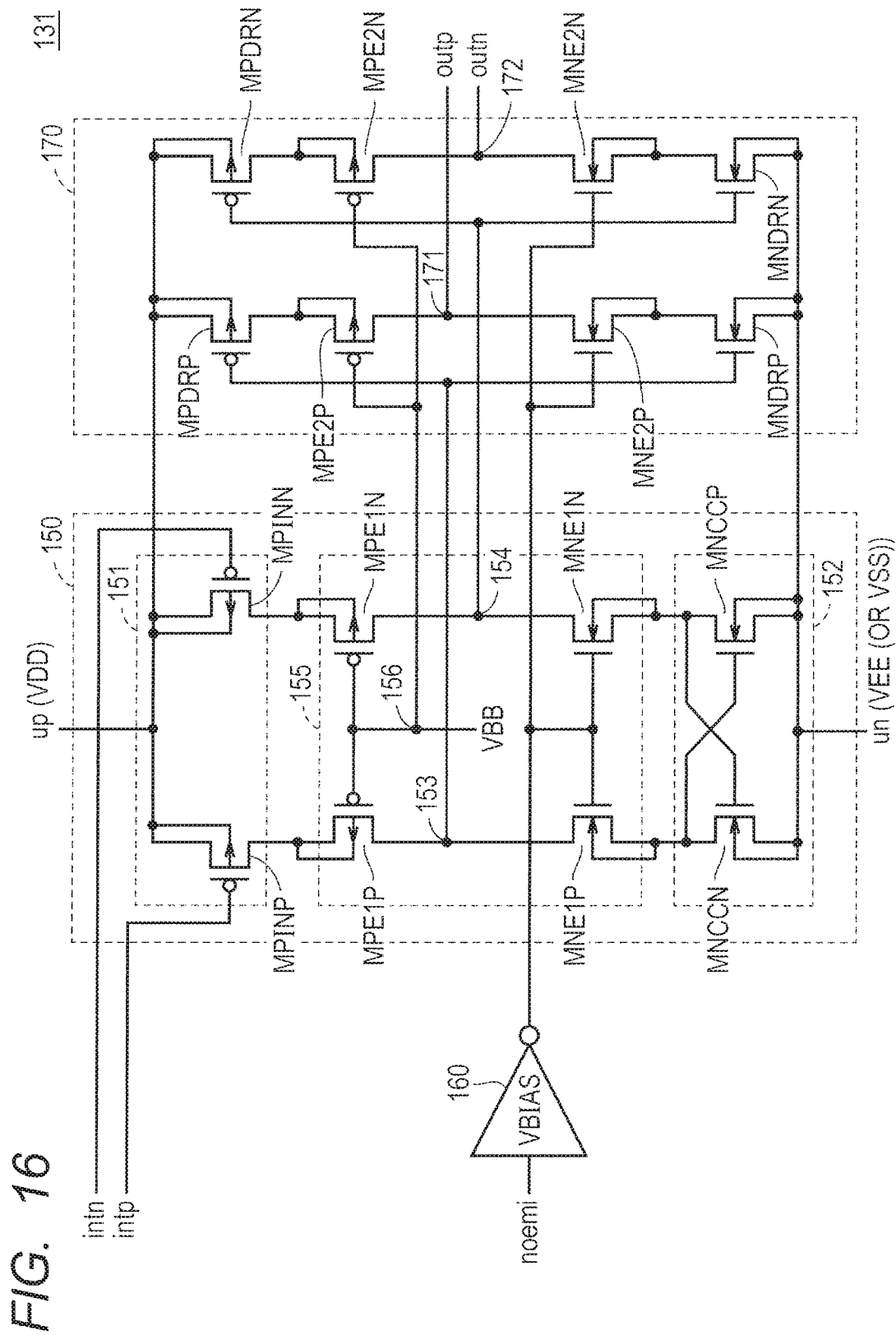
FIG. 16 is a circuit diagram illustrating a configuration example of a negative-voltage level shifter body in FIG. 14.

FIG. 16 is a circuit diagram illustrating a configuration example of the negative-voltage level shifter body in FIG. 14. The negative-voltage level shifter body 131 in FIG. 16 is different from the negative-voltage level shifter body 131 in FIG. 8 in that the shallow negative voltage VBB is applied to the gates of the breakdown-voltage relaxing PMOS transistors MPE1P, MPE1N, MPE2P, and MPE2N in place of the ground voltage VSS. The other points in FIG. 16 are the same as those in FIG. 8. Therefore, the same or corresponding portions are labeled with the same reference sign, and the description thereof is not repeated.

It is assumed that the ground voltage VSS is applied to the gates of the breakdown-voltage relaxing PMOS transistors MPE1P and MPE1N. In this case, the breakdown-voltage relaxing PMOS transistors MPE1P and MPE1N disturb an operation of the negative-voltage level shifter body 131, so that an effect provided by lowering a low level of the input signals inp and inn to the shallow low negative voltage VBB is lost. To prevent this, it is necessary to change the gate voltages of the breakdown-voltage relaxing PMOS transistors MPE1P, MPE1N, MPE2P, and MPE2N from the ground voltage VSS to the shallow negative voltage VBB.

[Use Condition of Negative-Voltage Level Shifter]

In the fourth embodiment, the output signals outp and outn of the negative-voltage level shifter body 131 are at a VDD/VEE level. Therefore, the above-described negative-voltage level shifter 130 cannot be used for controlling a switching NMOS transistor for allowing a VSS-level signal to pass therethrough. This is because the gate-to-source voltage Vgs in this case is VDD–VSS and therefore a sufficient gate-to-source voltage Vgs cannot be obtained when VDD is low.

However, in a case of allowing a signal at a negative voltage level to pass, that is, a case where a switch is closed when the voltage level of the signal is the ground voltage VSS, and is opened when the voltage level is a negative voltage, the above-described negative-voltage level shifter 130D can be used for controlling a switching NMOS transistor.

Specifically, while a negative high-voltage power supply is inactive (VEE=VSS), an output signal of the negative-voltage level shifter 130D is placed at a low level (VSS), thereby closing an NMOS transistor switch. While the negative high-voltage power supply is active (VEE<VSS), the output signal of the negative-voltage level shifter 130D is placed at a high level (VDD), thereby making the gate-to-source voltage of the switching NMOS transistor VDD–VEE. The gate-to-source voltage Vgs is sufficiently ensured when VEE is deep to some extent. Therefore, the NMOS transistor can be opened.

When the negative-voltage level shifter 130D is inverted, the input signals inp and inn of the negative-voltage level shifter 130D is switched while the negative high-voltage power supply is inactive. In this state, the gate-to-source voltage Vgs of the switching NMOS transistor is VDD–VSS. Therefore, the switching NMOS transistor cannot allow a signal to pass therethrough stably. Thereafter, when the negative high-voltage power supply is started, the negative-voltage level shifter body 131 is inverted at a time when the negative high voltage VEE becomes deep to some extent. In this state, the gate-to-source voltage Vgs of the switching NMOS transistor is VDD–VEE. Therefore, the switching NMOS transistor can allow a signal to pass therethrough stably.

[Advantageous Effect of Fourth Embodiment]

As described above, the fourth embodiment has described that, if a use condition of a negative-voltage level shifter is limited, a voltage of the positive power-supply node up of a negative-voltage level shifter body can be returned from the medium voltage VBIAS to the low power-supply voltage VDD. Accordingly, a medium-voltage generating circuit for the level shifter body is no longer required, and therefore it is possible to largely reduce a layout area of the negative-voltage level shifter.

Fifth Embodiment

In the first to fourth embodiment, the constant current supplies I1 and I2 in the power-supply control signal generating circuit 134 always operate. Therefore, constant DC current power consumption is generated. However, in a state where no negative voltage is generated, this constant current is an unnecessary current when it is not necessary to cause a negative-voltage level shifter to operate. The fifth embodiment describes a configuration of a negative-voltage level shifter 130E that has a function of stopping the constant current supplies I1 and I2 in the power-supply control signal generating circuit 134.

[Overall Configuration of Negative-Voltage Level Shifter]

Figure 17:
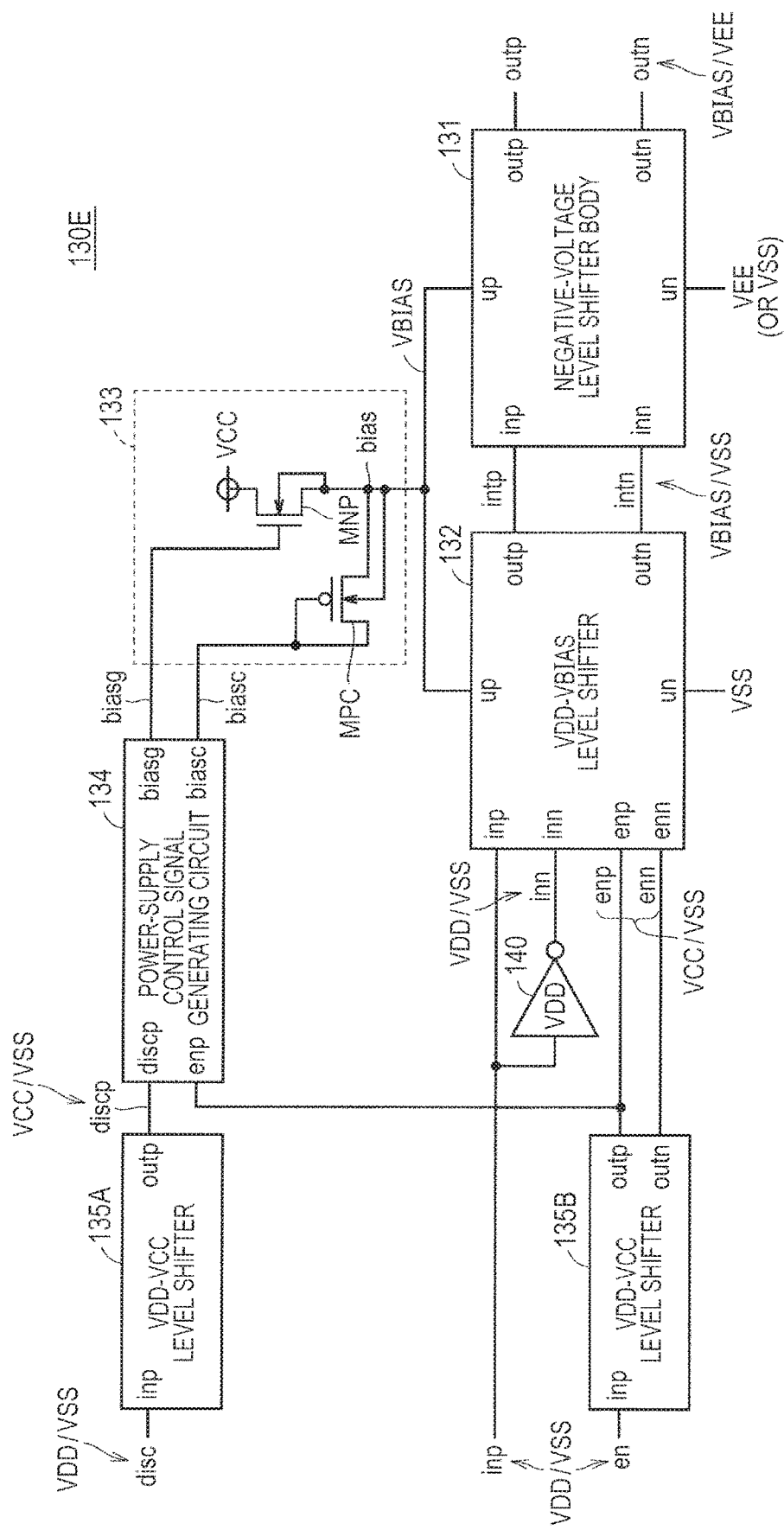
FIG. 17 illustrates a configuration of a negative-voltage level shifter in a semiconductor device according to a fifth embodiment.

FIG. 17 illustrates a configuration of a negative-voltage level shifter in a semiconductor device according to the fifth embodiment. The negative-voltage level shifter 130E in FIG. 17 is different from the negative-voltage level shifter 130 in FIG. 6 in that an enable signal en and a discharge signal disc are added and the former level shifter 130E further includes VDD–VCC level shifters 135A and 135B.

The enable signal en is a control signal for determining an operation time period of the negative-voltage level shifter 130E. The discharge signal disc is a signal for determining a timing at which electric charges of the power-supply node bias are caused to be discharged by the control signal biasc.

Each of the VDD–VCC level shifters 135A and 135B converts a VDD/VSS-level signal into a VCC/VSS level. Specifically, the VDD–VCC level shifter 135A converts the VDD/VSS-level discharge signal disc into a VCC/VSS-level discharge signal discp, and outputs the discharge signal discp to the power-supply control signal generating circuit 134. The VDD–VCC level shifter 135B converts the VDD/VSS-level enable signal en into complementary VCC/VSS-level enable signals enp and enn, outputs the enable signal enp to the power-supply control signal generating circuit 134 and the VDD–VBIAS level shifter 132, and outputs the enable signal enn to the VDD–VBIAS level shifter 132.

Further, the power-supply control signal generating circuit 134 is additionally provided with a function of cutting a constant current supply, and the VDD–VBIAS level shifter 132 in the previous stage is additionally provided with a function of fixing an output when being stopped. An example of the detailed configuration of these circuit components are described below.

The other points of the negative-voltage level shifter 130E in FIG. 17 are the same as those of the negative-voltage level shifter 130 in FIG. 6. Therefore, the same or corresponding portions are labeled with the same reference sign, and the description thereof is not repeated.

[Configuration Example of VDD–VBIAS Level Shifter]

Figure 18:
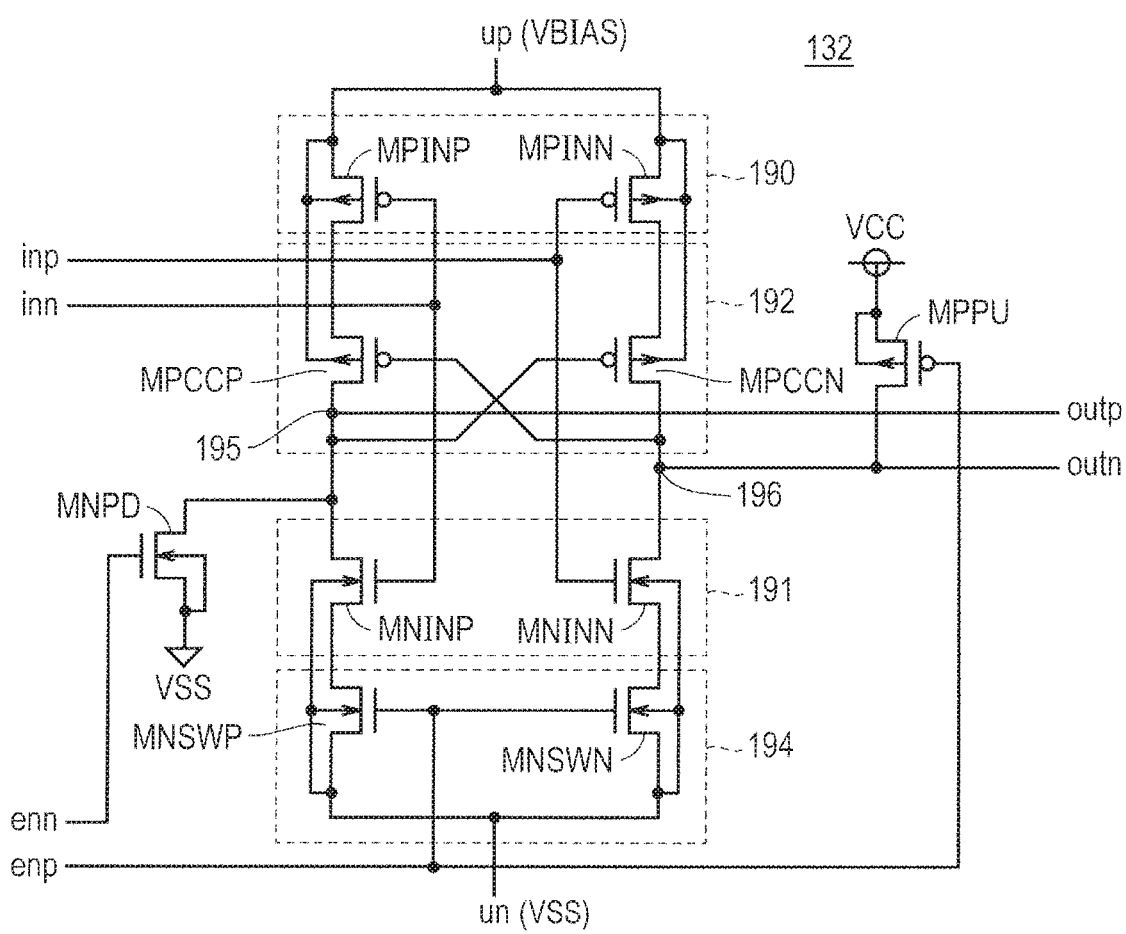
FIG. 18 is a circuit diagram illustrating a configuration example of a VDD-VBIAS level shifter in FIG. 17.

FIG. 18 is a circuit diagram illustrating a configuration example of the VDD–VBIAS level shifter in FIG. 17. The VDD–VBIAS level shifter 132 in FIG. 18 is different from the VDD–VBIAS level shifter 132 in FIG. 9 in that the former one further includes a pull-up PMOS transistor MPPU and a pull-down NMOS transistor MNPD, which fix output when the level shifter 132 is stopped, and cut NMOS transistors MNSWP and MNSWN that prevent a through current when output is fixed.

The pull-up PMOS transistor MPPU is coupled between a VCC node and the coupling node 196 for outputting the output signal outn. To the gate of the pull-up PMOS transistor MPPU, the enable signal enp is input. The back gate of the pull-up PMOS transistor PMOS is coupled to the VCC node.

The pull-down NMOS transistor MNPD is coupled between the coupling node 195 for outputting the output signal outp and a VSS node. To the gate of the pull-down PMOS transistor MNPD, the enable signal enn is input. The back gate of the pull-down NMOS transistor PMOS is coupled to the VSS node.

The cut NMOS transistors MNSWP and MNSWN (194) are coupled to the input NMOS transistors MNINP and MNINN (191) and the negative power-supply node un, respectively. To the gates of the input NMOS transistors MNINP and MNINN, the enable signal enp is input. The back gates of the cut NMOS transistors MNSWP and MNSWN are coupled to the negative power-supply node un.

The other points in FIG. 18 are the same as those in FIG. 9. Therefore, the same or corresponding portions are labeled with the same reference sign, and the description thereof is not repeated.

[Configuration Example of Power-Supply Control Signal Generating Circuit]

Figure 19:
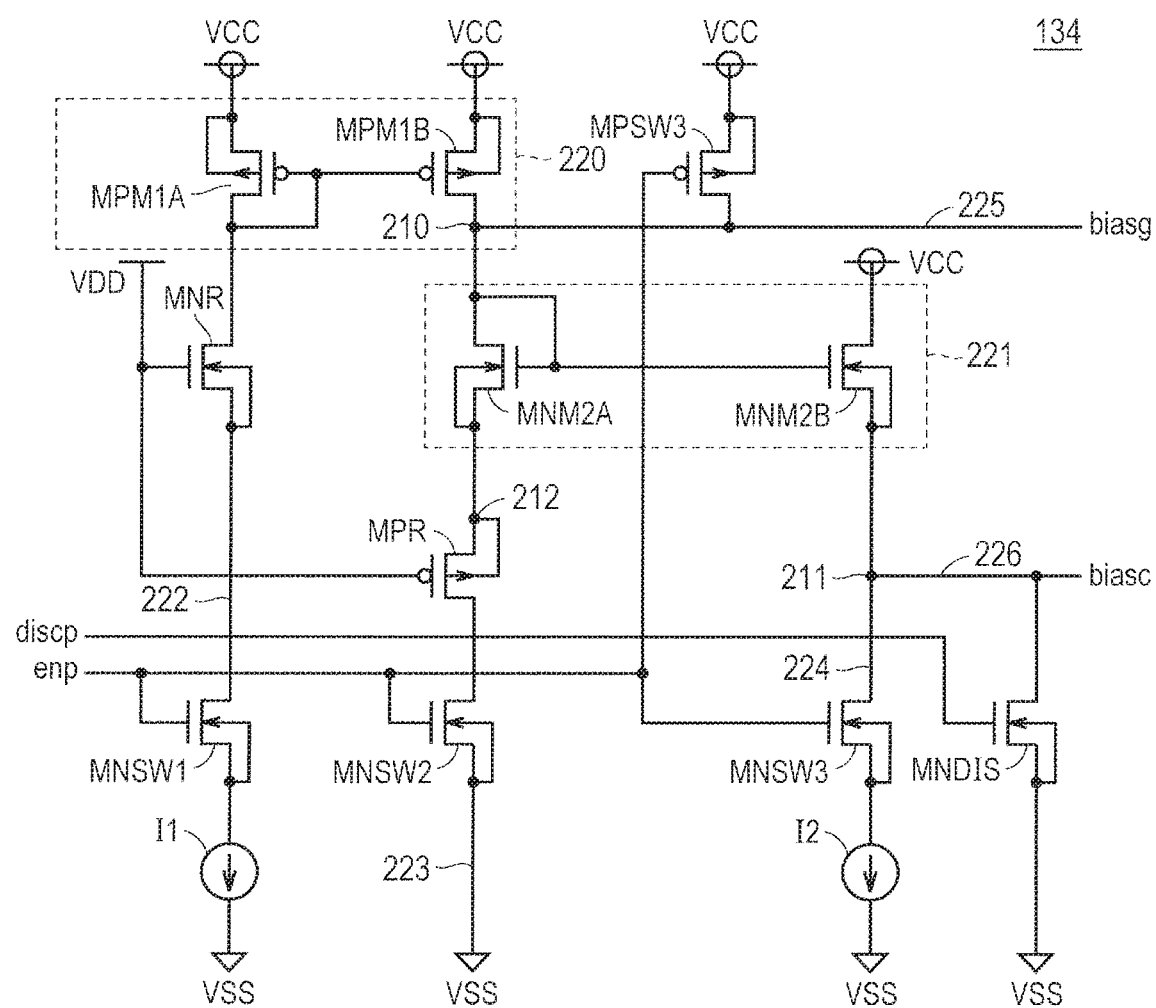
FIG. 19 is a circuit diagram illustrating a configuration example of a power-supply control signal generating circuit in FIG. 17.

FIG. 19 is a circuit diagram illustrating a configuration example of the power-supply control signal generating circuit in FIG. 17. The power-supply control signal generating circuit 134 in FIG. 19 is different from the power-supply control signal generating circuit 134 in FIG. 10 in that the former one further includes switching NMOS transistors MNSW1, MNSW2, and MNSW3, a switching PMOS transistors MPSW3, and an NMOS transistor MNDIS.

The switching NMOS transistors MNSW1, MNSW2, and MNSW3 are provided for cutting the current paths 222, 223, and 224, respectively, when the negative-voltage level shifter 130E is stopped.

Specifically, the switching NMOS transistor MNSW1 is coupled on the current path 222 between the NMOS transistor MNR and the current supply I1 in series thereto. The switching NMOS transistor MNSW2 is coupled on the current path 223 between the PMOS transistor MPR and the VSS node in series thereto. The switching NMOS transistor MNSW3 is coupled on the current path 224 between the NMOS transistor MNM2B and the current supply I2 in series thereto. To the gates of the switching NMOS transistors MNSW1, MNSW2, and MNSW3, the enable signal enp is input. The back gates of the switching NMOS transistors MNSW1, MNSW2, and MNSW3 are coupled to the respective sources.

The PMOS transistor MPSW3 is provided for fixing a value of the control signal biasg to the medium power-supply voltage VCC when the negative-voltage level shifter 130E is stopped. Specifically, the switching PMOS transistor MPSW3 is coupled between a coupling node 210 for outputting the control signal biasg and the VCC node. To the gates of the PMOS transistors MPSW3, the enable signal enp is input. The back gate of the PMOS transistor MPSW3 is coupled to the VCC node.

The NMOS transistor MNDIS is provided for pulling out electric charges via the signal line 226 for supplying the control signal biasc when the negative-voltage level shifter 130E is stopped. Specifically, the NMOS transistor MNDIS is coupled between the signal line 226 and the VSS node. To the gate of the NMOS transistor MNDIS, the discharge signal discp is input. The back gate of the NMOS transistor MNDIS is coupled to the VSS node.

[Operation of Negative-Voltage Level Shifter]

Figure 20:
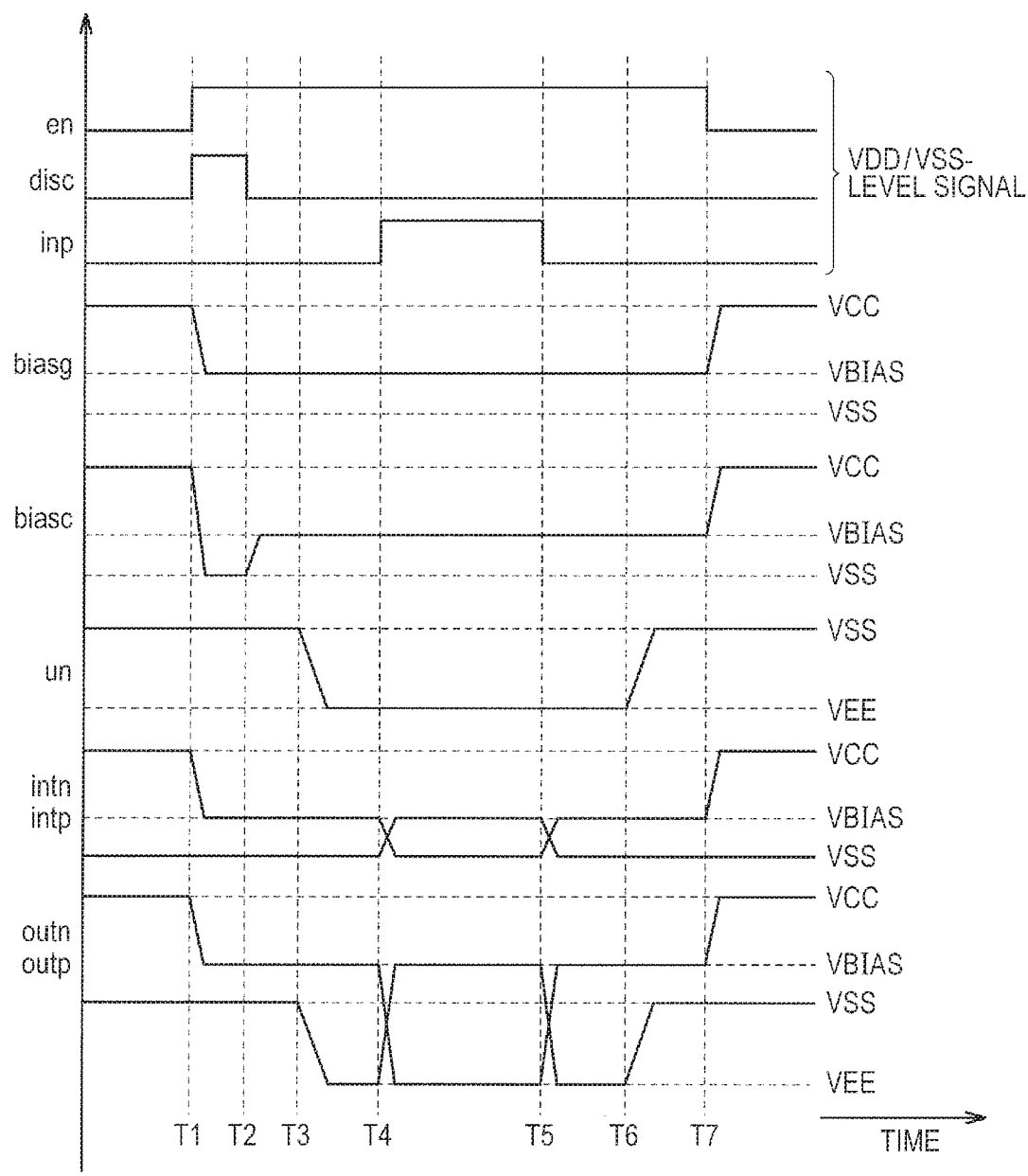
FIG. 20 is a timing chart for explaining an operation of the negative-voltage level shifter in FIG. 17.

FIG. 20 is a timing chart for explaining an operation of the negative-voltage level shifter in FIG. 17.

An operation of the negative-voltage level shifter 130E is described with reference to FIGS. 17 to 20. In the following description, a high level is referred to as "H" and a low level is referred to as "L".

First, in a state where a negative-voltage level shifter is not operated before time T1, en="L" and disc="L". Because of this, the current paths 222, 223, and 224 in FIG. 19 are all cut by the switching NMOS transistors MNSW1, MNSW2, and MNSW3. Also, both values of the control signals biasg and biasc are fixed to the medium power-supply voltage VCC by the PMOS transistor MPSW3 and the NMOS transistor MNDIS in FIG. 19.

Further, in the VDD–VBIAS level shifter 132 in FIG. 18, the enable signal enp is "L" and the enable signal enp is "H". Therefore, the coupling node 195 is fixed to the ground voltage VSS, and the coupling node 196 is fixed to the medium power-supply voltage VCC. Accordingly, the output signals outp and outn of the VDD–VBIAS level shifter 132 are fixed to VSS and VCC, respectively, the input signals intp and intn of the negative-voltage level shifter body 131 are fixed to VSS and VCC, respectively, and the output signals outp and outn are fixed to VSS and VCC, respectively.

At time T1, en is set to "H" in order to operate the negative-voltage level shifter 130E. Thus, disconnection of all the current paths in FIG. 19 and fixing of output are released. Because of this, a high level of the input signals intp and intn and a high level of the output signals outp and outn are lowered to the medium voltage VBIAS form the medium power-supply voltage VCC. Thus, an inverting operation of the negative-voltage level shifter 130E becomes possible.

The discharge signal disc is limited to an "H" level together with the enable signal en at time T1, but is limited to an "L" level at time T2 that is time after a predetermined time passes. The reason for this is as follows. Because a value of the control signal biasc is VCC in the initial state, it is necessary to pull out electric charges from the signal line 226 for supplying the control signal biasc at start of the normal state. However, in the power-supply control signal generating circuit 134 in FIG. 10, a path for pulling out the electric charges from the signal line 226 is the current path 224 only. In addition, there exists the constant current supply I2 in the current path 224. Therefore, it takes too much time until the value of the control signal biasc becomes stable to be the medium voltage VBIAS. Thus, the electric charges of the signal line 226 are discharged to around VSS via the NMOS transistor MNDIS once, and thereafter the discharge signal disc is placed at "L" and the signal line 226 is charged in such a manner that the value of the control signal biasc becomes around VBIAS. This method can make the value of the control signal biasc stable quickly. In FIG. 20, the discharge signal disc is limited to an "H" level only during a time period from time T1 to time T2.

Thereafter, inversion of the negative-voltage level shifter is possible in both cases where the voltage of the negative power-supply node un is VSS and VEE. In the case of FIG. 20, the negative high voltage VEE is generated by activation of the negative high-voltage power supply at time T3 and the voltage of the negative power-supply node un becomes VEE (<VSS), and thereafter the input signal inp is inverted at time T4 and time T5.

Thereafter, the operation of the negative high-voltage power supply is stopped at time T6. As a result, the voltage of the negative power-supply node un returns to the ground voltage VSS.

At time T7, to complete the operation, the value of the enable signal is placed at an "L" level while the negative high-voltage power supply is stopped. Thus, the negative high-voltage level shifter enters to a ready state. That is, the current paths 222, 223, and 224 in FIG. 19 are disconnected, and both the output signals biasg and biasc are fixed to VCC. At the same time, the voltages of the internal coupling nodes 195 and 196 in FIG. 18 are fixed on an unselected side. A high level of the input signals intp and intn and a high level of the output signals outp and outn are changed from the medium voltage VBIAS to the medium power-supply voltage VCC (>VBIAS).

[Advantageous Effect of Fifth Embodiment]

As described above, according to the fifth embodiment, it is possible to stop current consumption by the power-supply control signal generating circuit 134 when a negative high-voltage level shifter is not used. Thus, in a state where a negative high-voltage power supply does not generate a negative voltage, it is possible to reduce unnecessary current consumption.

Sixth Embodiment

The first to fifth embodiments illustrate that a breakdown-voltage relaxing level shifter in FIG. 8 or FIG. 16 can be used for relaxing the breakdown voltage of the negative-voltage level shifter body 131. A problem of those breakdown-voltage relaxing level shifters is in that, because a breakdown-voltage relaxing circuit in the driver stage 170 has a two-stage configuration of a PMOS transistor and an NMOS transistor, the area becomes large. In particular, for the NMOS transistor in the breakdown-voltage relaxing circuit, it is also necessary to consider breakdown-voltage relaxation against a substrate. Therefore, it is necessary to separate wells, and increase of the area becomes very large. The sixth embodiment illustrates a negative-voltage level shifter that has solved this problem.

[Overall Configuration of Negative-Voltage Level Shifter]

Figure 21:
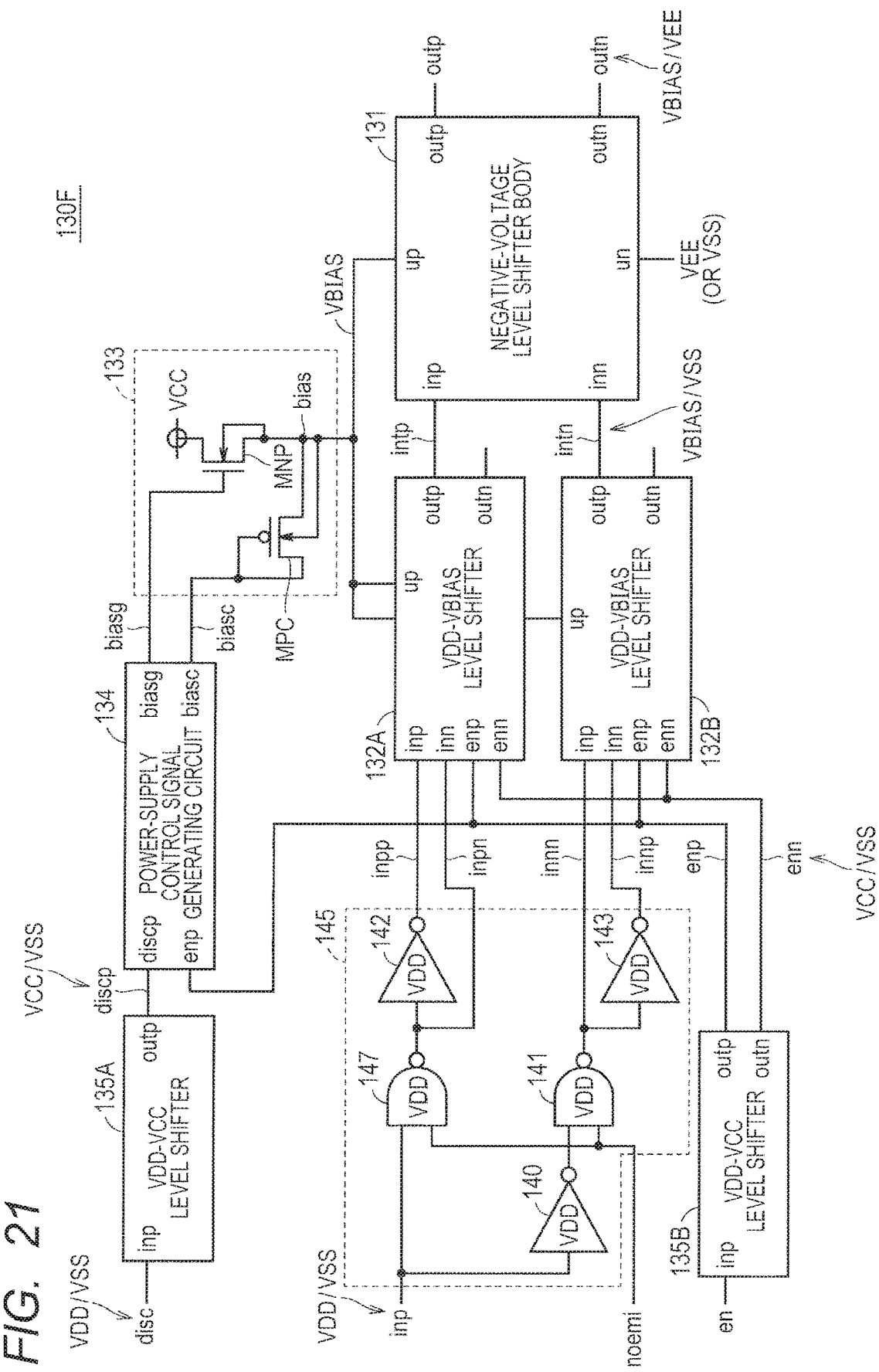
FIG. 21 illustrates a configuration of a negative-voltage level shifter in a semiconductor device according to a sixth embodiment.

FIG. 21 illustrates a configuration of a negative-voltage level shifter in a semiconductor device according to the sixth embodiment. A negative-voltage level shifter 130F in FIG. 21 is different from the negative-voltage level shifter 130E in FIG. 17 in that a function of placing both the input signals intp and intn of the negative-voltage level shifter body 131 at a "H" level is added.

Specifically, in the case of FIG. 21, the VDD–VBIAS level shifter 132 in the previous stage is separated into a VDD–VBIAS level shifter 132A for converting the input signal intp and a VDD–VBIAS level shifter 132B for converting the input signal intn. Those level shifters can be controlled independently of each other. Further, a logic circuit 145 is added, which controls input signals inpp, inpn, innp, and innn in such a manner that both the input signals intp and intn are placed at a "H" level when the breakdown-voltage relaxation control signal noemi="H" (that is, breakdown-voltage relaxation is effective while a negative high power-supply voltage is active).

In the example of FIG. 21, the logic circuit 145 includes inverters 140, 142, and 143 that operate with the low power-supply voltage VDD and NAND gates 141 and 147 that operate with the low power-supply voltage VDD.

More specifically, the logical AND of the input signal inp and the breakdown-voltage relaxation control signal noemi is input to the VDD–VBIAS level shifter 132A as the input signal inpp by the NAND gate 147 and the inverter 142. A signal obtained by inverting the logical AND of the input signal inp and the breakdown-voltage relaxation control signal noemi is input to the VDD–VBIAS level shifter 132A as the input signal inpn.

Similarly, a signal obtained by inverting the logical AND of the input signal inp and the breakdown-voltage relaxation control signal noemi by the NAND gate 141 and the inverters 140 and 143 is input to the VDD–VBIAS level shifter 132B as the input signal innp. The logical AND of the input signal inp and the breakdown-voltage relaxation control signal noemi is input to the VDD–VBIAS level shifter 132B as the input signal innn.

Because the configuration of each of the VDD–VBIAS level shifters 132A and 132B in FIG. 21 is the same as that described with reference to FIG. 18, the description thereof is not repeated.

[Configuration Example of Negative-Voltage Level Shifter Body]

Figure 22:
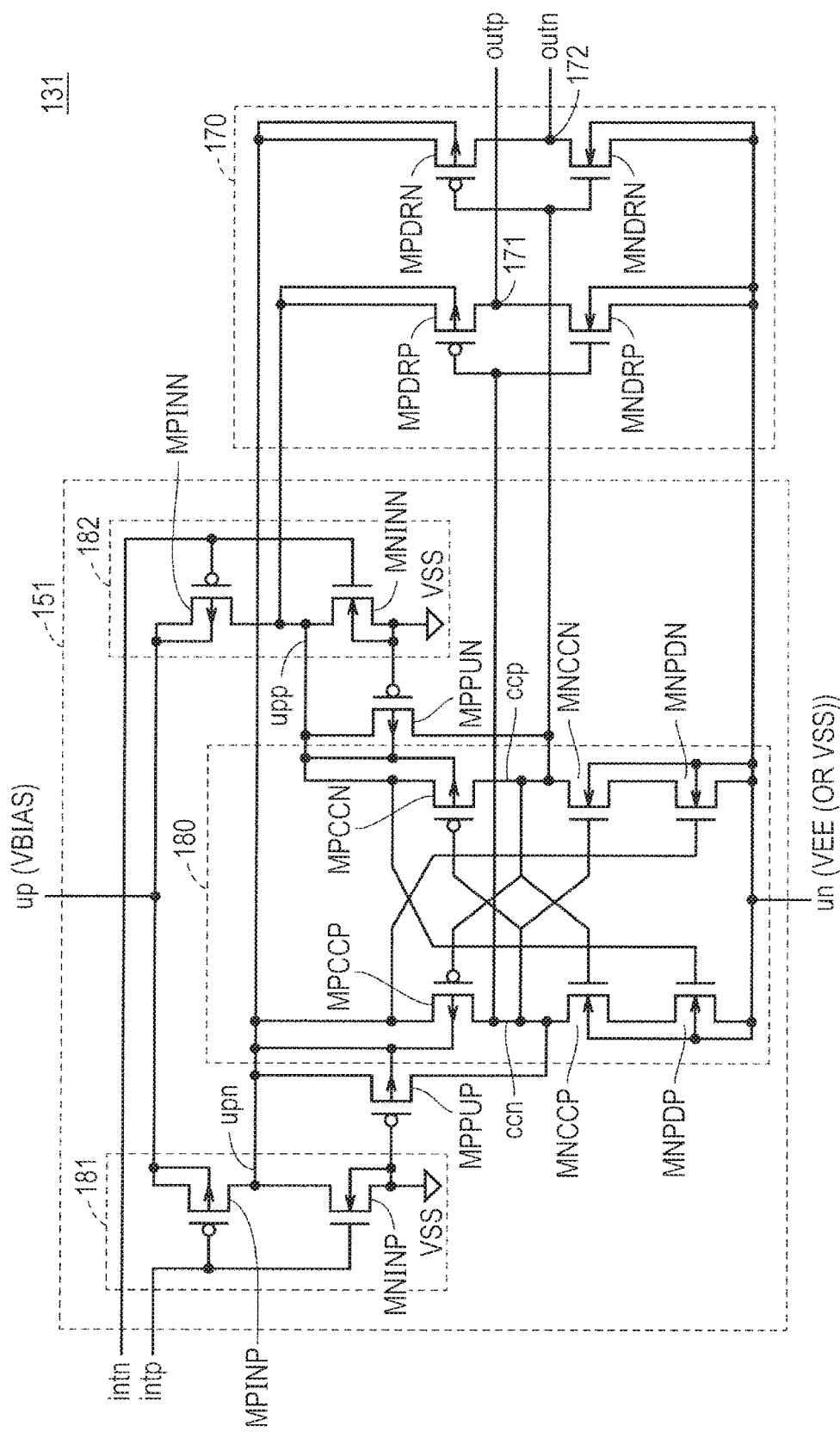
FIG. 22 is a circuit diagram illustrating a configuration example of a negative-voltage level shifter body in FIG. 21.

FIG. 22 is a circuit diagram illustrating a configuration example of the negative-voltage level shifter body in FIG. 21. The negative-voltage level shifter body 131 in FIG. 22 is additionally provided with a function of being capable of making the voltages of both the positive power-supply node upp and upn of the driver stage 170 the ground voltage VSS when the breakdown-voltage relaxation control signal noemi is at a high level (that is, breakdown-voltage relaxation is effective). Therefore, even in the configuration of the driver stage 170 that does not include a breakdown-voltage relaxing circuit, it is possible to achieve breakdown-voltage relaxation for a driver MOS transistor.

Referring to FIG. 22, the negative-voltage level shifter body 131 includes the level shifter stage 150 and the driver stage 170. The level shifter stage 150 includes input circuits 181 and 182, a latch circuit 180, and pull-up PMOS transistors MPPUP and MPPUN.

The input circuit 181 includes an input PMOS transistor MPINP and an input NMOS transistor MNINP. The input PMOS transistor MPINP and the input NMOS transistor MNINP are coupled between the positive power-supply node up and the VSS node in series in that order. The input signal intp is input to the gate of the input PMOS transistor MPINP and the gate of the input NMOS transistor MNINP. The back gates of the input PMOS transistor MPINP and the input NMOS transistor MNINP are coupled to the respective sources. A coupling node upn between the input PMOS transistor MPINP and the input NMOS transistor MNINP is used as a first power-supply node upn for the latch circuit 180 and the driver stage 170.

Similarly, the input circuit 182 includes an input PMOS transistor MPINN and an input NMOS transistor MNINN. The input PMOS transistor MPINN and the input NMOS transistor MNINN are coupled between the positive power-supply node up and the VSS node in series in that order. The input signal intn is input to the gate of the input PMOS transistor MPINN and the gate of the input NMOS transistor MNINN. The back gates of the input PMOS transistor MPINN and the input NMOS transistor MNINN are coupled to the respective sources. A coupling node upp between the input PMOS transistor MPINN and the input NMOS transistor MNINN is used as a second power-supply node upp for the latch circuit 180 and the driver stage 170.

The latch circuit 180 includes cross-coupled PMOS transistors MPCCP and MPCCN, cross-coupled NMOS transistors MNCCP and MNCCN, and pull-down NMOS transistors MNPDP and MNPDN.

The PMOS transistor MPCCP and the cross-coupled NMOS transistor MNCCP, and the pull-down NMOS transistor MNPDP are coupled between the positive power-supply node upn and the negative power-supply node un in series in that order. Similarly, the PMOS transistor MPCCN, and the cross-coupled NMOS transistor MNCCN, and the pull-down NMOS transistor MNPDN are coupled between the positive power-supply node upp and the negative power-supply node un series in that order. In the following description, a coupling node between the PMOS transistor MPCCP the cross-coupled NMOS transistor MNCCP is referred to ccn, and a coupling node between the PMOS transistor MPCCN and the cross-coupled NMOS transistor MNCCN is referred to as ccp.

The gates and the sources of the cross-coupled PMOS transistors MPCCP and MPCCN are cross-coupled. The back gate of the cross-coupled PMOS transistor MPCCP is coupled to the positive power-supply node upn. The back gate of the PMOS transistor MPCCN is coupled to the positive power-supply node upp.

The gates and the sources of the cross-coupled NMOS transistors MNCCP and MNCCN are cross-coupled. The back gates of the cross-coupled NMOS transistors MNCCP and MNCCN are coupled to the negative power-supply node un.

The gate of the pull-down NMOS transistor MNPDP is coupled to the positive power-supply node upp, and the back gate thereof is coupled to the negative power-supply node un. The gate of the pull-down NMOS transistor MNPDN is coupled to the positive power-supply node upn, and the back gate is coupled to the negative power-supply node un.

The pull-up PMOS transistor MPPUP is coupled between the coupling node ccn and the positive power-supply node upn. The gate of the pull-up PMOS transistor MPPUP is coupled to the VSS node, and the back gate thereof is coupled to the positive power-supply node upn. The pull-up PMOS transistor MPPUN is coupled between the coupling node ccp and the positive power-supply node upp. The gate of the pull-up PMOS transistor MPPU is coupled to the VSS node, and the back gate thereof is coupled to the positive power-supply node upp.

The configuration of the driver stage 170 is the same as the driver stage 170 that does not include a breakdown-voltage relaxing circuit in FIG. 7. The gate of each of the driver PMOS transistor MPDRP and the driver NMOS transistor MNDRP is coupled to the coupling node ccn. The gate of each of the driver PMOS transistor MPDRN and the driver NMOS transistor MNDRN is coupled to the coupling node ccp.

[Operation of Negative-Voltage Level Shifter]

An operation of the negative-voltage level shifter 130F is described below with reference to FIGS. 21 and 22.

First, in a case where breakdown-voltage is ineffective (that is, the breakdown-voltage relaxing control signal noemi="L"), when an "H" level is input as the input signal inp of the negative-voltage level shifter 130F, intp="H" and intn="L". By operations of the input circuits 181 and 182, the voltage of the positive power-supply node upp becomes equal to the voltage of the positive power-supply node up, and the voltage of the positive power-supply node upn becomes the ground voltage VSS. As a result, the voltage of the coupling node ccp is pulled up to the voltage of the positive power-supply node up by the pull-up PMOS transistor MPPUN. The voltage of the coupling node ccn is pulled down to the voltage of the negative power-supply node un by the pull-down NMOS transistor MNPDP. When the voltages of the coupling nodes ccp and ccn are changed to some extent, a through current is cut off by the latch circuit 180 configured by the cross-coupled MOS transistors MPCCP, MNCP, MPCCN, and MNCCN.

The driver stage 170 outputs an "H" level as the output signal outp. Because the voltage of the positive power-supply node upp is equal to the voltage of the positive power-supply node up, the voltage level of the output signal outp is equal to the voltage of the positive power-supply node up. Further, the driver stage 170 outputs an "L" level as the output signal outn. Although the voltage of the positive power-supply node upn is equal to the ground voltage VSS, the voltage level of the output signal outn is equal to the voltage of the negative power-supply node un.

Next, when the input signal inp of the negative-voltage level shifter 130F is changed from a "H" level to a "L" level, the input signals intp and intn are changed to a "L" level and a "H" level, respectively. As a result, the voltage of the coupling node ccp is pulled down to the voltage of the negative power-supply node un by the pull-down NMOS transistor MNPDN. The voltage of the coupling node ccn is pulled up to the voltage of the positive power-supply node up by the pull-up PMOS transistor MPPUP. When the voltages of the coupling nodes ccp and ccn are changed to some extent, the latch circuit 180 is inverted to enter to a stable state. In this case, the voltage of the positive power-supply node upp becomes equal to the ground voltage VSS, and the voltage of the positive power-supply node upn becomes equal to the voltage of the positive power-supply node up. Meanwhile, the voltage level of the output signal outp is equal to the voltage of the negative power-supply node un, and the voltage level of the output signal outn is equal to the positive power-supply node up.

Next, in a case where the voltage of the negative power-supply node un is lower than the ground voltage VSS, when breakdown-voltage relaxation becomes effective (that is, the breakdown-voltage relaxation control signal noemi="H"), both the input signals intp and intn become an "H" level. Therefore, both the voltages of the positive power-supply nodes upp and upn become equal to the ground voltage VSS. In this case, the input signals cannot be received. However, because data is held in the latch circuit 180, the output becomes outp/outn=VSS/un or un/VSS in accordance with the data held in the latch circuit 180.

Figure 23:
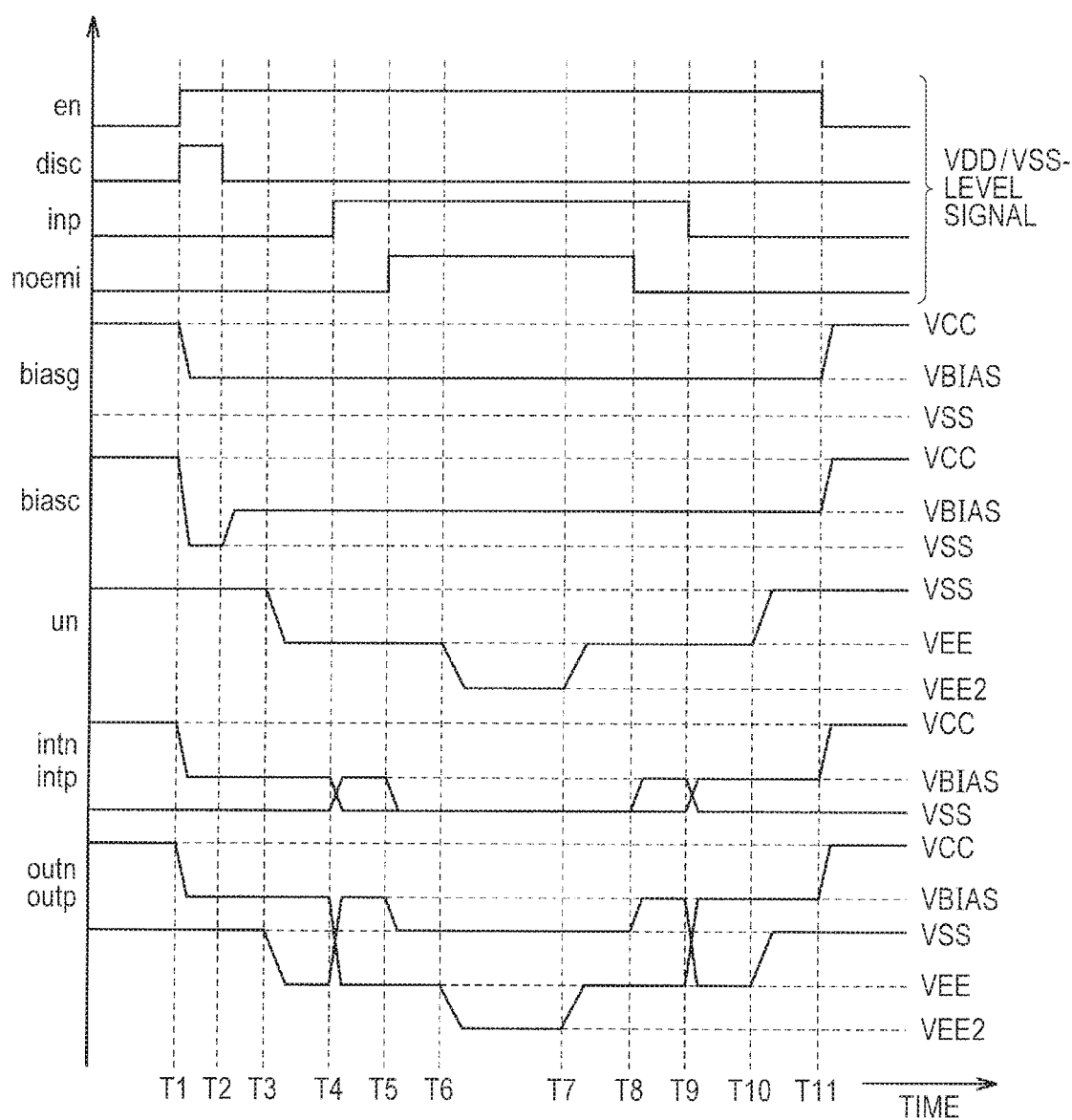
FIG. 23 is a timing chart for explaining a specific operation of the negative-voltage level shifter in FIG. 21.

FIG. 23 is a timing chart for explaining a specific operation of the negative-voltage level shifter in FIG. 21. An operation of the negative-voltage level shifter 130F is described below with reference to FIG. 19 and FIGS. 21 to 23.

First, at time T1, the enable signal en becomes an "H" level, so that fixing of output of the negative-voltage level shifter 130F is released and the negative-voltage level shifter 130F becomes operable. Thus, outputs of the input signals intp and intn and the output signals outp and outn are lowered to the medium voltage VBIAS from the medium power-supply voltage VCC.

Further, at time T1, the discharge signal disc becomes an "H" level, so that the signal line 226 for supplying the control signal biasc is discharged until the discharge signal becomes an "L" level at time T2.

Thereafter, a negative high voltage is generated by activation of the negative high-voltage power supply at time T3, and the voltage of the negative power-supply node un is lowered to VEE (a level at which breakdown-voltage relaxation is not necessary).

At time T4, the input signal inp is inverted, thus causing the input signals intp and intn and the output signals outp and outn to be inverted.

At time T5 before the negative high voltage becomes deeper, breakdown-voltage relaxation is made effective by placing the breakdown-voltage relaxation control signal noemi at an "H" level. Therefore, both the input signals intp and intn become VSS, and a high level of the output signals outp and outn are changed from the medium voltage VBIAS to the ground voltage VSS. Thereafter, at time T6, the voltage of the negative power-supply node un is further lowered to VEE2 (a level at which breakdown-voltage relaxation is required).

At time T7, the voltage of the negative power-supply node un returns from VEE2 to VEE. Then, at time T8 after the voltage of the negative power-supply node un returns to VEE, the breakdown-voltage relaxation control signal noemi is placed at an "L" level to release breakdown-voltage relaxation. Thus, an "H" level of the input signals intp and intn returns from the ground voltage VSS to the medium voltage VBIAS. Also, an "H" level of the output signals outp and outn returns from the ground voltage VSS to the medium voltage VBIAS. In this state, inversion of the input signal inp is possible.

At time T9, when the input signal inp is inverted, the input signals intp and intn and the output signals outp and outn are also inverted in association with that inversion.

At time T10, the operation of the negative high-voltage power supply is stopped. As a result, the voltage of the negative power-supply node un returns from the negative high voltage VEE to the ground voltage VSS.

After the negative high-voltage power supply is stopped, when the enable signal en is placed at a "L" level at time T11, the output of the negative-voltage level shifter 130F is fixed, and a "H" level of each of the input signals intp and intn and the output signals outp and outn returns from the medium voltage VBIAS to the medium power-supply voltage VCC.

[Advantageous Effect of Sixth Embodiment]

According to the configuration of the negative-voltage level shifter 130F described above, both the voltage levels of the input signals intp and intn of the negative-voltage level shifter body 131 are placed at a "H" level, thereby lowering the voltages of the positive power-supply nodes upp and upn of the driver stage 170 of the negative-voltage level shifter body 131 to the ground voltage VSS. Therefore, it is possible to relax breakdown voltage of a driver MOS transistor without inserting a breakdown-voltage relaxing MOS transistor into the driver stage 170. Accordingly, the breakdown-voltage relaxing MOS transistor that occupies a large area can be omitted, so that a negative-voltage level shifter can be configured to be relatively small.

In the above, the invention made by the inventors of the present application has been specifically described by way of the embodiments. However, it is naturally understood that the present invention is not limited to the aforementioned embodiments, and can be changed in various ways within the scope not departing from the gist thereof.

What is claimed is:

1. A semiconductor device comprising a negative-voltage level shifter,
   wherein the negative-voltage level shifter includes a first level shifter that converts a high level of an input signal from a positive first power-supply voltage to a first medium voltage, the first medium voltage being higher than the first power-supply voltage and being lower than a second power-supply voltage,
   wherein the negative-voltage level shifter further includes
   a second level shifter that converts a low level of an output signal of the first level shifter from a third power-supply voltage to a fourth power-supply voltage lower than the third power-supply voltage, and
   a first medium-voltage generating circuit that generates the first medium voltage, and
   wherein the first medium-voltage generating circuit includes
   a first NMOS (N-channel Metal Oxide Semiconductor) transistor coupled between a first medium-voltage node outputting the first medium voltage and a first power-supply node to which the second power-supply voltage is supplied, and
   a first PMOS (P-channel MOS) transistor that is coupled to the first medium-voltage node to be used as a path for discharging electric charges of the first medium-voltage node.

2. The semiconductor device according to claim 1, wherein the negative-voltage level shifter further includes a first control-signal generating circuit that generates a first control signal and a second control signal, the first control signal controlling a gate voltage of the first NMOS transistor, the second control signal controlling a gate voltage of the first PMOS transistor.

3. The semiconductor device according to claim 2,
   wherein the second level shifter converts a high level of the output signal of the first level shifter from the first medium voltage to a second medium voltage that is higher than the first power-supply voltage and is equal to or lower than the first medium voltage,
   wherein the negative-voltage level shifter further includes
   a second medium-voltage generating circuit that generates the second medium voltage, and
   wherein the second medium-voltage generating circuit includes
   a second NMOS transistor coupled between a second medium-voltage node outputting the second medium voltage and the first power-supply node, and
   a second PMOS transistor capable of discharging electric charges of the second medium-voltage node by being coupled to the second medium-voltage node.

4. The semiconductor device according to claim 3, wherein the first control-signal generating circuit supplies the first control signal to a gate of the second NMOS transistor and supplies the second control signal to a gate of the second PMOS transistor.

5. The semiconductor device according to claim 3, wherein the negative-voltage level shifter further includes a second control-signal generating circuit that generates a third control signal and a fourth control signal, the third control signal controlling a gate voltage of the second NMOS transistor, the fourth control signal controlling a gate voltage of the second PMOS transistor.

6. The semiconductor device according to claim 1,
wherein the third power-supply voltage is a negative voltage that is smaller than the fourth power-supply voltage in an absolute value, and
wherein the second level shifter converts a high level of the output signal of the first level shifter from the first medium voltage to the first power-supply voltage.

7. The semiconductor device according to claim 1, wherein a gate and a drain of the first PMOS transistor are coupled to each other.

8. The semiconductor device according to claim 1, wherein the first PMOS transistor is coupled between a node to which a constant voltage lower than a control voltage supplied to a gate thereof is supplied and the first medium-voltage node.

9. The semiconductor device according to claim 2,
wherein the first level shifter includes a third PMOS transistor and a third NMOS transistor to which the input signal is input, and
wherein the first control-signal generating circuit includes a fourth PMOS transistor that is a replica of the third PMOS transistor,
a fourth NMOS transistor that is a replica of the third NMOS transistor, and
a current mirror circuit for supplying currents having a predetermined current ratio to the fourth PMOS transistor and the fourth NMOS transistor.

10. The semiconductor device according to claim 9, wherein the first control-signal generating circuit further includes a first constant current supply provided on a current path of the third NMOS transistor.

11. The semiconductor device according to claim 9, wherein the first power-supply voltage is supplied to a gate of the fourth PMOS transistor and a gate of the fourth NMOS transistor.

12. The semiconductor device according to claim 11,
wherein the current mirror circuit is configured to make a current flowing through the fourth PMOS transistor and a current flowing through the fourth NMOS transistor equal to each other, and
wherein a size ratio of the fourth PMOS transistor to the third PMOS transistor is larger than a size ratio of the fourth NMOS transistor to the third NMOS transistor.

13. The semiconductor device according to claim 9,
wherein the first control-signal generating circuit further includes a diode-coupled fifth NMOS transistor that is a replica of the first NMOS transistor,
wherein the fifth NMOS transistor is coupled on a current path of the fourth PMOS transistor on a high-potential side of the fourth PMOS transistor, and
wherein the first control signal is a gate voltage of the fifth NMOS transistor.

14. The semiconductor device according to claim 13,
wherein the first control-signal generating circuit further includes a sixth NMOS transistor that is a replica of the first NMOS transistor,
wherein a gate of the sixth NMOS transistor is coupled to a gate of the fifth NMOS transistor, and
wherein the second control signal is a source voltage of the sixth NMOS transistor.

15. The semiconductor device according to claim 9,
wherein the first control-signal generating circuit further includes a plurality of switches that cut off a plurality of current paths exiting from or entering to the current mirror circuit in response to an enable signal, and
wherein the first level shifter includes a pull-up circuit and a pull-down circuit for fixing a voltage level of an output signal in response to the enable signal.

16. The semiconductor device according to claim 1,
wherein the second level shifter is configured to operate based on a voltage of a positive power-supply node, and
wherein the second level shifter is configured to be able to switch an input of the positive power-supply node to the first medium voltage or the third power-supply voltage.

17. The semiconductor device according to claim 16,
wherein the second level shifter performs conversion in response to complementary output signals output from the first level shifter, and
wherein the second level shifter is configured to switch the input of the positive power-supply node to the third power-supply voltage when both the complementary output signals are at a high level.

18. A semiconductor device comprising a negative-voltage level shifter,
wherein a first power-supply voltage and a second power-supply voltage higher than the first power-supply voltage are input to the semiconductor device,
wherein an input signal having a high level equal to the first power-supply voltage is input to the negative-voltage level shifter, and
wherein the negative-voltage level shifter includes
a first level shifter that includes a first positive power-supply node and a first negative power-supply node, converts the high level of the input signal to a voltage of the first positive power-supply node, and converts a low level of the input signal to a voltage of the first negative power-supply node,
a second level shifter that has a second positive power-supply node and a second negative power-supply node coupled to a negative power supply, converts a high level of an output signal of the first level shifter to a voltage of the second positive power-supply node, and converts a low level of the output signal to a voltage of the second negative power-supply node,
an NMOS transistor having a source coupled to the first and second positive power-supply nodes and a drain to which the second power-supply voltage is applied, and
a PMOS transistor having a source coupled to the first and second positive power-supply nodes and a drain that is coupled to a gate or to which a constant voltage lower than a control voltage supplied to the gate is supplied.

* * * * *